(12) United States Patent
Saeki et al.

(10) Patent No.: US 11,385,422 B2
(45) Date of Patent: Jul. 12, 2022

(54) OPTICAL SEMICONDUCTOR DEVICE AND OPTICAL MODULE

(71) Applicant: Sumitomo Electric Industries, Ltd., Osaka (JP)

(72) Inventors: Tomoya Saeki, Osaka (JP); Yasushi Fujimura, Osaka (JP); Taichi Misawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 26 days.

(21) Appl. No.: 17/178,100

(22) Filed: Feb. 17, 2021

(65) Prior Publication Data

US 2021/0255406 A1  Aug. 19, 2021

(30) Foreign Application Priority Data

Feb. 19, 2020 (JP) .............................. JP2020-026406

(51) Int. Cl.
*G02B 6/42* (2006.01)
*H01S 5/02345* (2021.01)

(52) U.S. Cl.
CPC ......... *G02B 6/4257* (2013.01); *G02B 6/4206* (2013.01); *G02B 6/4244* (2013.01); *H01S 5/02345* (2021.01)

(58) Field of Classification Search
None
See application file for complete search history.

(56) References Cited

U.S. PATENT DOCUMENTS

| 6,868,104 | B2* | 3/2005 | Stewart | H01S 5/02212 372/36 |
| 6,948,863 | B2* | 9/2005 | Ito | G02B 6/4292 257/E25.032 |
| 6,949,731 | B2* | 9/2005 | Ito | H03F 3/087 250/214 R |
| 6,996,304 | B2* | 2/2006 | Aronson | H01S 5/02212 257/E23.19 |
| 7,192,201 | B2* | 3/2007 | Kato | H01S 5/02212 372/38.1 |

(Continued)

FOREIGN PATENT DOCUMENTS

JP 2013-021220 A 1/2013

*Primary Examiner* — Jerry Rahll
(74) *Attorney, Agent, or Firm* — Baker Botts L.L.P.; Michael A. Sartori

(57) ABSTRACT

An optical semiconductor device comprises: a first wiring pattern provided on a carrier mounting surface of a dielectric substrate; a first reference potential pattern surrounding the first wiring pattern; a carrier block provided on the carrier mounting surface and having a main surface, a side surface, and a second wiring pattern and a second reference potential pattern constituting coplanar lines; and an optical semiconductor element provided on the main surface. One end portion of the second wiring pattern extends to at least an end edge on the side surface side in the main surface and is conductively joined to the first wiring pattern with a conductive joining material therebetween. One end portion of the second reference potential pattern extends to at least the end edge on the side surface side in the main surface and is conductively joined to the first reference potential pattern with a conductive joining material therebetween.

15 Claims, 19 Drawing Sheets

(56) References Cited

U.S. PATENT DOCUMENTS

| | | | | |
|---|---|---|---|---|
| 7,196,389 B2* | 3/2007 | Yasui | H01S 5/02345 | 257/433 |
| 7,201,521 B2* | 4/2007 | Zheng | G02B 6/4201 | 385/94 |
| 7,217,955 B2* | 5/2007 | Hamaoka | H01S 5/0234 | 372/50.21 |
| 7,218,657 B2* | 5/2007 | Kihara | H01S 5/02212 | 372/54 |
| 7,416,351 B2* | 8/2008 | Fujimura | G02B 6/4279 | 257/467 |
| 7,463,659 B2* | 12/2008 | Go | H01S 5/02212 | 372/36 |
| 7,837,398 B2* | 11/2010 | Sato | H01S 5/02253 | 385/92 |
| 8,743,564 B2* | 6/2014 | Kuwahara | H01L 31/0203 | 257/432 |
| 9,172,209 B2* | 10/2015 | Deng | H01S 5/02453 | |
| 9,625,671 B2* | 4/2017 | Vorndran | G02B 19/0014 | |
| 11,129,279 B2* | 9/2021 | Noguchi | H05K 1/14 | |
| 2004/0008953 A1* | 1/2004 | Ito | G02B 6/4201 | 257/E25.032 |
| 2004/0179562 A1* | 9/2004 | Carroll | H01S 5/02212 | 372/36 |
| 2004/0208211 A1* | 10/2004 | Maruyama | H01S 5/02212 | 372/38.1 |
| 2004/0247004 A1* | 12/2004 | Keh | H01S 5/02212 | 372/36 |
| 2005/0013561 A1* | 1/2005 | Kuhara | G02B 6/4243 | 385/92 |
| 2005/0047460 A1* | 3/2005 | Go | H01S 5/02212 | 372/36 |
| 2005/0047461 A1* | 3/2005 | Kihara | H01S 5/02212 | 372/36 |
| 2005/0047732 A1* | 3/2005 | Kato | H01S 5/02212 | 385/92 |
| 2005/0105911 A1* | 5/2005 | Keh | H01S 5/02212 | 398/138 |
| 2013/0222908 A1* | 8/2013 | Yeh | H01S 5/0064 | 359/483.01 |
| 2020/0192038 A1* | 6/2020 | Noguchi | G02B 6/4248 | |
| 2021/0076500 A1* | 3/2021 | Noguchi | H05K 1/14 | |
| 2021/0271038 A1* | 9/2021 | Noguchi | G02B 6/4246 | |
| 2021/0351563 A1* | 11/2021 | Noguchi | H01S 5/02212 | |
| 2022/0103262 A1* | 3/2022 | Noguchi | H01L 24/37 | |

* cited by examiner

OPTICAL SEMICONDUCTOR DEVICE AND OPTICAL MODULE

CROSS-REFERENCE TO RELATED APPLICATIONS

This application is based upon and claims the benefit of the priority from Japanese Patent Application No. 2020-026406, filed on Feb. 19, 2020, the entire contents of which are incorporated herein by reference.

TECHNICAL FIELD

The present disclosure relates to an optical semiconductor device and an optical module.

BACKGROUND

Japanese Unexamined Patent Publication No. 2013-021220 discloses a technology related to an optical module. This optical module includes a ceramic package mounted an optical element, a metal lid covering an opening of the ceramic package, and a sleeve connected to the lid with a joint sleeve therebetween for connecting an optical fiber. The lid is constituted of a flat portion joined to the ceramic package and a cylinder portion to which the joint sleeve is fitted. In this optical module, the optical element is mounted inside the ceramic package such that a mounting surface of the ceramic package and a surface of the optical element are parallel to each other. An optical axis of the optical element is refracted by 90° using a prism.

SUMMARY

The present disclosure provides an optical semiconductor device. The optical semiconductor device comprises: a dielectric substrate having a carrier mounting surface; a first wiring pattern provided on the carrier mounting surface; a first reference potential pattern provided on the carrier mounting surface and surrounding the first wiring pattern in a manner of being separated from the first wiring pattern; a carrier block provided on the carrier mounting surface and having a main surface extending in a direction intersecting the carrier mounting surface, a side surface facing the carrier mounting surface, and a second wiring pattern and a second reference potential pattern disposed on the main surface and constituting coplanar lines; and an optical semiconductor element provided on the main surface of the carrier block. One end portion of the second wiring pattern extends to at least an end edge on the side surface side in the main surface and is conductively joined to the first wiring pattern with a conductive joining material therebetween. The other end portion of the second wiring pattern is electrically connected to the optical semiconductor element. One end portion of the second reference potential pattern extends to at least the end edge on the side surface side in the main surface and is conductively joined to the first reference potential pattern with a conductive joining material therebetween.

The present disclosure provides an optical module. The optical module comprises the foregoing optical semiconductor device; and an optical receptacle attached to the foregoing optical semiconductor device and connected to an optical fiber.

DETAILED DESCRIPTION

Figure 1:
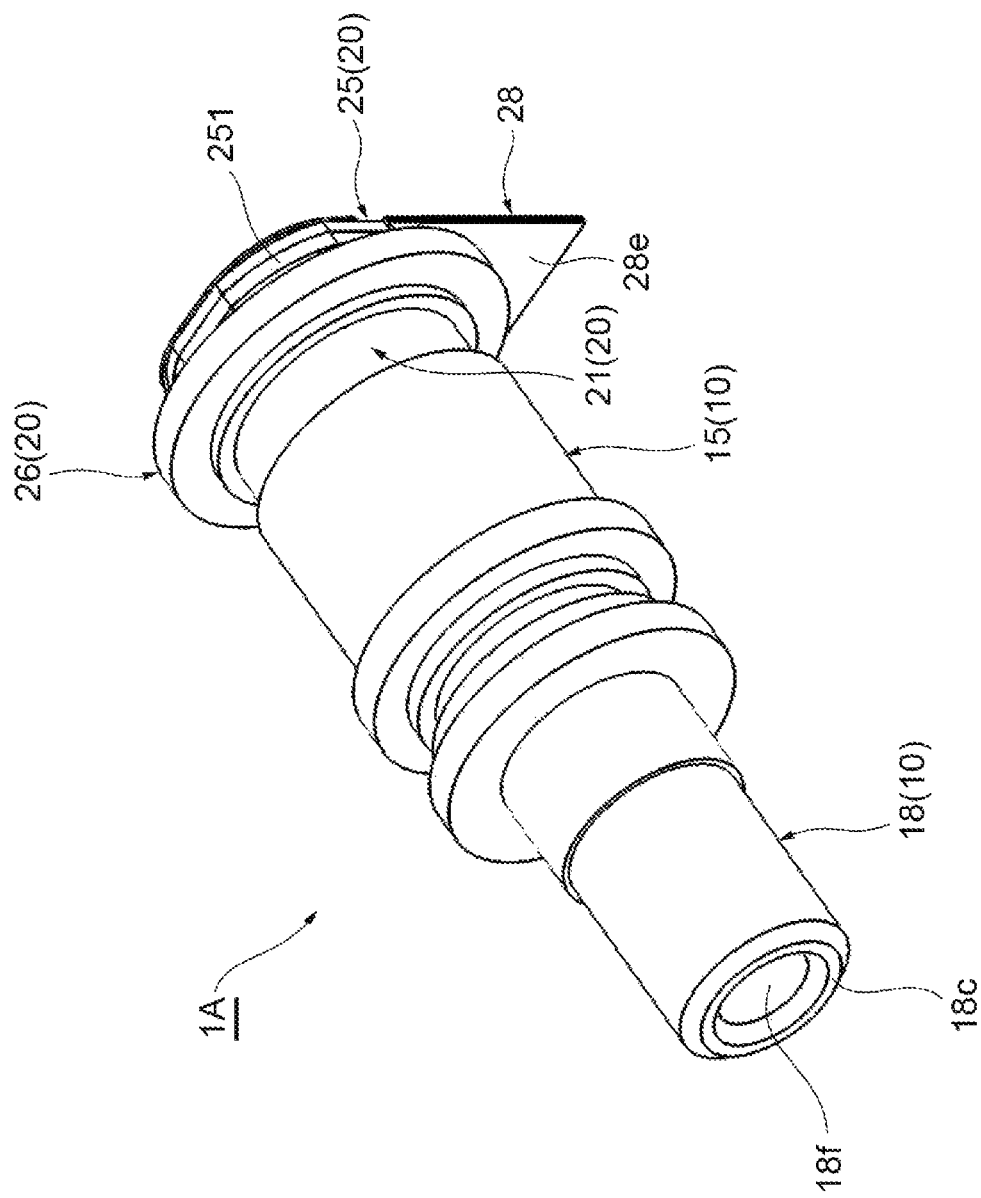
FIG. 1 is a perspective view illustrating an appearance of an optical transmission module including an optical semiconductor device according to an embodiment and illustrates an appearance of the optical transmission module obliquely viewed from above.

[Problem to be Solved by Present Disclosure]

In optical modules used for optical communication, in accordance with the recent increase in transmission speeds, it is required to reduce the number of places at which there is mismatching of a characteristic impedance in a transmission line in order to realize high-quality transmission of high-frequency signals. A coaxial structure has sometimes been employed for recent optical modules. In the related art, a lead pin is used in an input/output path for high-frequency signals in a coaxial optical module. For example, when a coaxial optical module includes an edge face emitting-type optical semiconductor element such as a laser diode, a direction of the optical semiconductor element becomes a direction in which a package inner surface having a protruding lead pin and an optical axis of the optical semiconductor element intersect each other. Therefore, generally, a distal end of the lead pin protruding from the package inner surface and the optical semiconductor element are electrically connected to each other through wire bonding. However, since a bonding wire has a small diameter (for example, $\phi 25$ μm), it has a relatively large inductance. Hence, mismatching of a characteristic impedance is likely to occur at a place in the bonding wire.

In the structure disclosed in Japanese Unexamined Patent Publication No. 2013-021220, a bonding wire on a transmission path is eliminated by directly mounting an optical element on a mounting surface of a ceramic package. However, in this structure, a prism is used for refracting an optical axis of the optical element. In this case, there is a need to increase a size of the package in order to secure a mounting region of the prism. Moreover, since there is a need for the prism to have a longer optical length for refracting the optical axis, optical design is restricted. Specifically, there is a need to expand an effective diameter of light in order to reduce vignetting of light, but a distance between the optical element and a lens is lengthened. Generally, there is a need for the lens to have an optical magnification of approximately five to six times in order to achieve optical coupling to a single-mode optical fiber. Hence, the entire optical length is lengthened, thereby causing hindrance in miniaturization of the optical module.

[Effects of Present Disclosure]

According to the present disclosure, it is possible to provide an optical semiconductor device and an optical module in which mismatching of a characteristic impedance can be reduced while increase of a package in size is curbed.

[Description of Embodiment of Present Disclosure]

First, an embodiment of the present disclosure will be enumerated and described. An optical semiconductor device according to the embodiment comprises: a dielectric substrate having a carrier mounting surface; a first wiring pattern provided on the carrier mounting surface; a first reference potential pattern provided on the carrier mounting surface and surrounding the first wiring pattern in a manner of being separated from the first wiring pattern; a carrier block provided on the carrier mounting surface and having a main surface extending in a direction intersecting the carrier mounting surface, a side surface facing the carrier mounting surface, and a second wiring pattern and a second reference potential pattern constituting coplanar lines; and an optical semiconductor element provided on the main surface of the carrier block. One end portion of the second wiring pattern extends to at least an end edge on the side surface side in the main surface and is conductively joined to the first wiring pattern with a conductive joining material therebetween. The other end portion of the second wiring pattern is electrically connected to the optical semiconductor element. One end portion of the second reference potential pattern extends to at least the end edge on the side surface side in the main surface and is conductively joined to the first reference potential pattern with a conductive joining material therebetween.

In this optical semiconductor device, one end portions of the coplanar lines on the carrier block extend to at least the end edge on the side surface side in the main surface. Further, the second wiring pattern and the second reference potential pattern constituting the coplanar lines are conductively joined to the first wiring pattern and the first reference potential pattern provided on the carrier mounting surface of the dielectric substrate respectively with a conductive joining material therebetween. That is, in the optical semiconductor device described above, the coplanar lines on the carrier block can be connected to the first wiring pattern and the first reference potential pattern in a configuration having a smaller inductance than that of a bonding wire. Therefore, mismatching of a characteristic impedance is unlikely to occur. Moreover, according to the foregoing optical semiconductor device, the bonding wire need only be simply replaced with a conductive joining material. Therefore, compared to the structure disclosed in Japanese Unexamined Patent Publication No. 2013-021220, increase of a package in size can be curbed. As above, according to the foregoing optical semiconductor device, mismatching of a characteristic impedance can be reduced while increase of a package in size is curbed.

In the optical semiconductor device described above, a gap between the one end portion of the second reference potential pattern and the one end portion of the second wiring pattern on the main surface may be larger than a gap between a remaining portion of the second reference potential pattern and a remaining portion of the second wiring pattern on the main surface. In this case, mismatching of a characteristic impedance can be more effectively reduced.

In the optical semiconductor device described above, each of the one end portions of the second wiring pattern and the second reference potential pattern may extend from the main surface to the side surface. In this case, the second wiring pattern and the second reference potential pattern on the side surface of the carrier block face the first wiring pattern and the first reference potential pattern on the carrier mounting surface of the dielectric substrate. Therefore, with a conductive joining material therebetween, the first wiring pattern and the second wiring pattern can be firmly joined to each other and the first reference potential pattern and the second reference potential pattern can be firmly joined to each other. Therefore, reliability of conductive joining between the first wiring pattern and the second wiring pattern and between the first reference potential pattern and the second reference potential pattern is enhanced, and joining strength between the carrier block and the dielectric substrate can be enhanced.

In the optical semiconductor device described above, the carrier block may have a first groove provided between the second reference potential pattern and the second wiring pattern on the side surface. In this case, the conductive joining material between the first wiring pattern and the second wiring pattern and the conductive joining material between the first reference potential pattern and the second reference potential pattern can be more reliably separated from each other, and a risk of a short circuiting the first wiring pattern and the second wiring pattern to the first reference potential pattern and the second reference potential pattern can be reduced. Moreover, in this case, the carrier block may further have a second groove provided on the side surface. The second reference potential pattern and the second wiring pattern may be positioned in one region sandwiching the second groove. Accordingly, a risk of a short circuiting the first wiring pattern and the second wiring pattern to the first reference potential pattern and the second reference potential pattern can be further reduced.

In the optical semiconductor device described above, the other end portion of the second wiring pattern may extend to a part immediately below the optical semiconductor element and be conductively joined to a back electrode of the optical semiconductor element with a conductive joining material therebetween. In this case, compared to a case in which the second wiring pattern and the optical semiconductor element are connected to each other through wire bonding, mismatching of a characteristic impedance can be further reduced.

The foregoing optical semiconductor device may further include a metal cap with a window provided on the carrier mounting surface of the dielectric substrate and covering the carrier block and the optical semiconductor element. In this case, the carrier block and the optical semiconductor element can be suitably protected.

The foregoing optical semiconductor device may further include a first penetration wiring electrically connected to the first wiring pattern and a wiring provided on an opposite surface positioned on a side opposite to the carrier mounting surface, and penetrating the dielectric substrate from the carrier mounting surface to the opposite surface; and a second penetration wiring electrically connected to the second wiring pattern and another wiring provided on the opposite surface positioned on a side opposite to the carrier mounting surface, and penetrating the dielectric substrate from the carrier mounting surface to the opposite surface. In this case, the coplanar lines on the carrier block and the wirings connected to parts outside the optical semiconductor device can be connected to each other in a configuration having a smaller inductance than that of the bonding wire.

An optical module according to another embodiment comprises the foregoing optical semiconductor device; and an optical receptacle attached to the foregoing optical semiconductor device and connected to an optical fiber.

[Details of Embodiment of Present Disclosure]

Specific examples of an optical semiconductor device and an optical module of the present disclosure will be described below with reference to the drawings. The present invention is not limited to these examples, is indicated by the claims, and is intended to include all the changes within the meaning and the scope equivalent to the claims. In the following description, the same reference signs will be applied to the same elements in description of the drawings, and duplicate description will be omitted.

Figure 2:
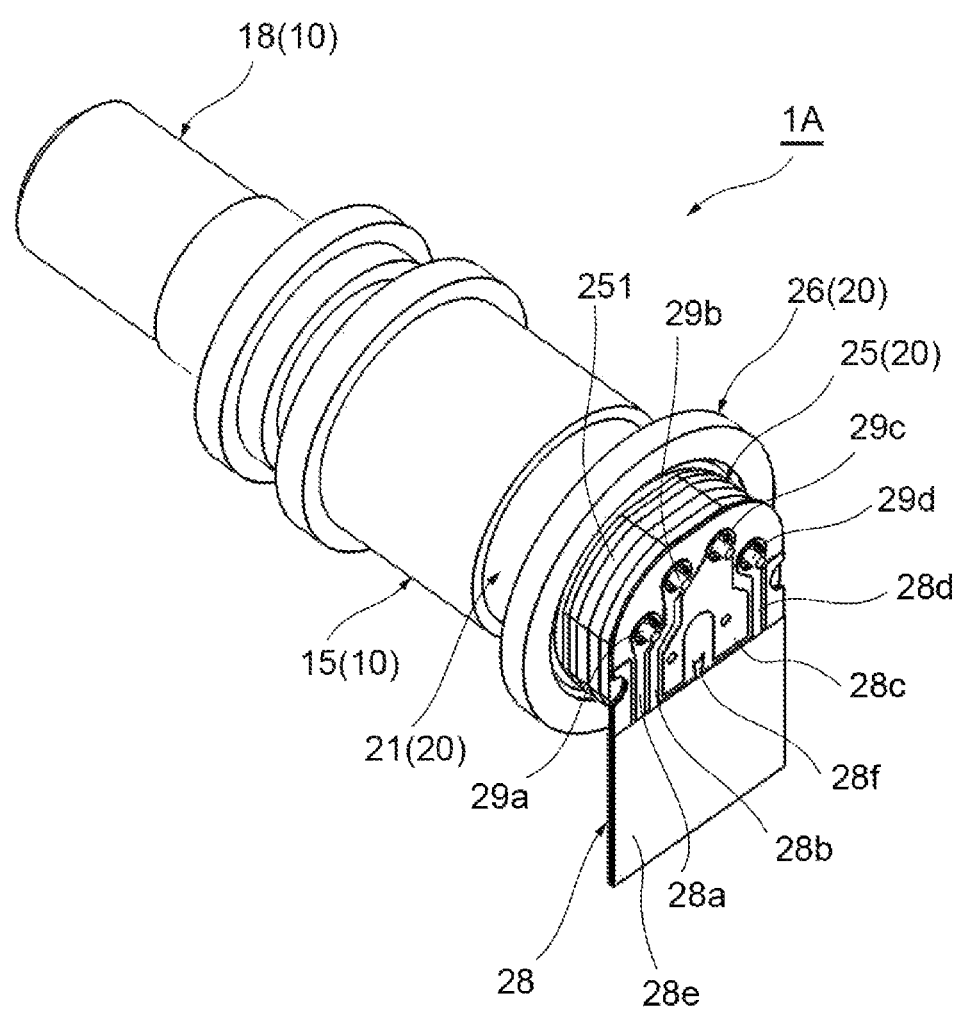
FIG. 2 is a perspective view illustrating another appearance of the optical transmission module illustrated in FIG. 1 and illustrates an appearance of the optical transmission module obliquely viewed from below.
Figure 3:
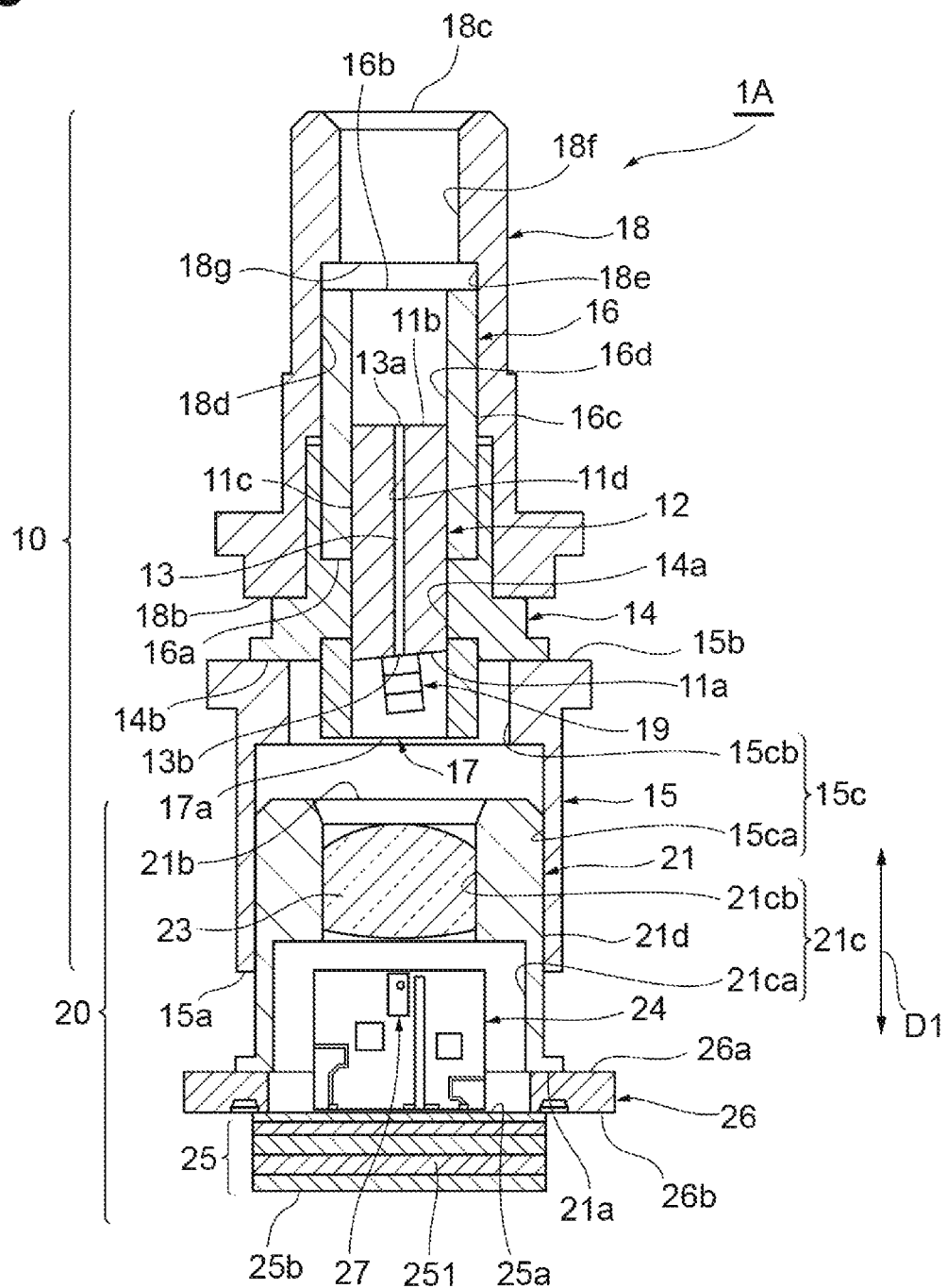
FIG. 3 is a cross-sectional view illustrating a configuration of the optical transmission module illustrated in FIG. 1 and illustrates a cross section along an optical axis of incident light.

FIGS. 1 and 2 are perspective views illustrating appearances of an optical transmission module 1A including the optical semiconductor device according to an embodiment. FIG. 1 illustrates an appearance of the optical transmission module 1A obliquely viewed from above. FIG. 2 illustrates another appearance of the optical transmission module 1A obliquely viewed from below. FIG. 3 is a cross-sectional view illustrating a configuration of the optical transmission module 1A and illustrates a cross section along an optical axis of incident light. The optical transmission module 1A constitutes a part of an optical receiver used for long distance optical communication. As illustrated in FIGS. 1, 2, and 3, the optical transmission module 1A includes an optical receptacle 10 connected to an optical fiber, and a light emitting portion 20 fixed to the optical receptacle 10. The optical receptacle 10 has a fiber stub (stub ferrule) 12, metal members 14 and 15, a sleeve 16, and a hull member (shell) 18. The fiber stub 12 has a ferrule 11 and an optical fiber 13.

The ferrule 11 is a member having a cylindrical shape (or a columnar shape). A center axis of the ferrule 11 extends in a direction D1. A cross section perpendicular to the center axis of the ferrule 11 has a circular shape. The ferrule 11 has a base end surface 11a and a distal end surface 11b arranged in the direction D1. The distal end surface 11b is a surface for performing physical contact with a ferrule of an optical connector connected to the optical receptacle 10. The distal end surface 11b is polished to have a spherical surface shape. The base end surface 11a is a surface on a side opposite to the distal end surface 11b. The base end surface 11a faces the light emitting portion 20 attached to the optical receptacle 10. The base end surface 11a is slightly inclined (for example, by approximately 8°) with respect to a surface perpendicular to the center axis of the ferrule 11. The ferrule 11 further has an outer circumferential surface 11c that is a columnar surface.

The ferrule 11 further has a fiber holding hole 11d. The fiber holding hole 11d extends in the direction D1 and is formed on a central axis of the ferrule 11. A cross section of the fiber holding hole 11d perpendicular to the direction D1 has a circular shape. An inner diameter of the fiber holding hole 11d is slightly larger than an outer diameter of the optical fiber 13. One opening of the fiber holding hole 11d is included on the distal end surface 11b. The other opening of the fiber holding hole 11d is included on the base end surface 11a. Therefore, the fiber holding hole 11d penetrates the ferrule 11 between the base end surface 11a and the distal end surface 11b thereof in the direction D1. For example, the ferrule 11 is made of zirconia ($ZrO_2$). Since the ferrule 11 is formed of zirconia having a high toughness and a high Young's modulus, physical contact can be suitably performed on the distal end surface 11b.

For example, the optical fiber 13 is a single-mode fiber. For example, the optical fiber 13 is a naked fiber from which a resin coating is removed. For example, the optical fiber 13 is made of quartz. The optical fiber 13 extends while having the direction D1 as a longitudinal direction (that is, an optical axis direction) thereof. The optical fiber 13 has one end 13a and the other end 13b. The optical fiber 13 is inserted into the fiber holding hole 11d. Further, the one end 13a is exposed from an opening of the fiber holding hole 11d on the distal end surface 11b side, and the other end 13b is exposed from an opening of the fiber holding hole 11d on the base end surface 11a side. The one end 13a comes into contact with one end of the optical fiber of the optical connector connected to the optical receptacle 10. The other end 13b is optically coupled to an end face emitting element 27 of the light emitting portion 20, which will be described below. For example, the outer diameter of the optical fiber 13 is 125 μm.

An optical isolator 19 is fixed to the base end surface 11a. The optical isolator 19 is an optical element allowing light to pass therethrough in only one direction and cutting light in a reverse direction. The optical isolator 19 is disposed on an optical axis of the optical fiber 13 and is optically coupled to the other end 13b of the optical fiber 13. The optical isolator 19 allows light output from the end face emitting element 27 to pass therethrough such that the light is input to the other end 13b of the optical fiber 13 and blocks return light from the other end 13b of the optical fiber 13.

A metal member 14 is a member having a penetration hole 14a extending in the direction D1 and holding the fiber stub 12 inside the penetration hole 14a. For example, the metal member 14 is formed of a metal material such as stainless steel. The metal member 14 has substantially a cylindrical shape extending in the direction D1. A cross section of the penetration hole 14a perpendicular to the direction D1 has a circular shape. The metal member 14 further has a base end surface 14b. The base end surface 14b faces the metal member 15. The fiber stub 12 is press-fitted into the penetration hole 14a of the metal member 14 in the direction D1. That is, the outer circumferential surface 11c of the ferrule 11 is in contact with an inner surface of the penetration hole 14a. Accordingly, the fiber stub 12 is fixed to the metal member 14. A cylinder member 17 protrudes in the direction D1 from the base end surface 14b of the metal member 14. The cylinder member 17 is provided around the optical isolator 19. A distance from a base end surface 17a of the cylinder member 17 to the light emitting portion 20 is shorter than a distance from the optical isolator 19 to the light emitting portion 20. Hence, the cylinder member 17 can protect the optical isolator 19.

The metal member 15 is substantially a cylindrical member having a base end surface 15a and a distal end surface 15b arranged in the direction D1. The distal end surface 15b faces the base end surface 14b of the metal member 14. The distal end surface 15b is joined to the base end surface 14b through YAG welding or the like. The metal member 15 further has a penetration hole 15c extending in the direction D1. The penetration hole 15c penetrates the metal member 15 between the base end surface 15a and the distal end surface 15b in the direction D1. The penetration hole 15c includes a first part 15ca extending from the base end surface 15a to a portion in the middle of the penetration hole 15c, and a second part 15cb extending from the distal end surface 15b to the first part 15ca. An inner diameter of the first part 15ca is larger than an inner diameter of the second part 15cb. The first part 15ca accommodates a part of the light emitting portion 20. The second part 15cb accommodates the cylinder member 17 and the optical isolator 19.

The sleeve 16 is a cylindrical member extending in the direction D1. For example, the sleeve 16 is made of ceramic. As an example, the sleeve 16 is formed of the same material (for example, zirconia) as the ferrule 11. An inner diameter of the sleeve 16 is almost equivalent to an outer diameter of the fiber stub 12. The sleeve 16 has a base end 16a and a distal end 16b arranged in the direction D1. Moreover, the sleeve 16 has an outer circumferential surface 16c and an inner circumferential surface 16d. The fiber stub 12 is inserted from an opening of the sleeve 16 on the base end 16a side. In other words, a part of the sleeve 16 on the base end 16a side is inserted into a clearance between the outer circumferential surface 11c of the ferrule 11 and the metal member 14. Therefore, the outer circumferential surface 16c of the sleeve 16 is in contact with the metal member 14, and the inner circumferential surface 16d of the sleeve 16 is in contact with the outer circumferential surface 11c of the ferrule 11. The ferrule of the optical connector is inserted from an opening of the sleeve 16 on the distal end 16b side. The distal end surface 11b of the ferrule 11 and a distal end surface of the ferrule of the optical connector come into contact with each other inside the sleeve 16. Accordingly, the optical fiber 13 held by the ferrule 11 and the optical fiber held by the ferrule of the optical connector are optically coupled to each other with high coupling efficiency.

The hull member 18 is a member fixed to the metal member 14 and connected to the optical connector. The hull member 18 is a cylindrical member extending in the direction D1. For example, the hull member 18 is made of metal such as stainless steel. The hull member 18 has a base end surface 18b and a distal end portion 18c arranged in the direction D1. Moreover, the hull member 18 has a penetration hole 18d extending in the direction D1. The penetration hole 18d penetrates the hull member 18 between the base end surface 18b and the distal end portion 18c. A cross section of the penetration hole 18d perpendicular to the direction D1 has a circular shape. A center axis of the penetration hole 18d overlaps a center axis of the fiber stub 12. As a part of the penetration hole 18d, the hull member 18 includes a first part 18e on the base end surface 18b side and a second part 18f on the distal end portion 18c side. The first part 18e extends from the base end surface 18b to the second part 18f in the direction D1. The second part 18f extends from the distal end portion 18c to the first part 18e in the direction D1. Further, the first part 18e and the second part 18f are connected to (communicate with) each other between the distal end 16b of the sleeve 16 and the distal end portion 18c. An inner diameter of the first part 18e is almost equivalent to or slightly larger than an outer diameter of the outer circumferential surface 16c of the sleeve 16. An inner diameter of the second part 18f is slightly larger than the inner diameter of the inner circumferential surface 16d of the sleeve 16. In this manner, since the inner diameter of the first part 18e is larger than the inner diameter of the second part 18f, a stepped surface 18g is formed between the first part 18e and the second part 18f. The stepped surface 18g faces the distal end 16b of the sleeve 16.

The light emitting portion 20 is an example of the optical semiconductor device according to the present embodiment. The light emitting portion 20 has a cap 21, a lens 23, a carrier block 24, a plate-shaped member 25, the end face emitting element 27, and a flexible substrate 28 (illustration thereof is omitted in FIG. 3).

The plate-shaped member 25 has a dielectric substrate 251. The dielectric substrate 251 is a flat plate-shaped member having substantially a circular shape. The dielectric substrate 251 has a flat carrier mounting surface 25a and a back surface 25b positioned on a side opposite to the carrier mounting surface 25a. The carrier mounting surface 25a intersects an optical axis of the optical fiber (that is, the optical axis of the optical fiber 13) connected to the optical receptacle 10. As an example, a normal line of the carrier mounting surface 25a is parallel to the optical axis of the optical fiber (that is, the optical axis of the optical fiber 13) connected to the optical receptacle 10. For example, the dielectric substrate 251 is formed of a material such as ceramic. As an example, the dielectric substrate 251 is a multi-layer ceramic substrate constituted of a plurality of laminated ceramic layers. High-frequency design is facilitated using a multi-layer ceramic substrate. As illustrated in FIG. 2, a plurality (four in the illustrated example) of terminals 29a, 29b, 29c, and 29d protrude from the back surface 25b of the dielectric substrate 251. Each of the terminals 29a, 29b, 29c, and 29d is a penetration wiring penetrating the dielectric substrate 251 between the carrier mounting surface 25a and the back surface 25b. Among these, the terminal 29c is a second penetration wiring set to have a reference potential. A via 25i (FIG. 7) penetrating the dielectric substrate 251 from the carrier mounting surface 25a to the back surface 25b is provided in the dielectric substrate 251. The via 25i is a first penetration wiring for transmitting a high-frequency transmission signal.

The cap 21 is a metal member having substantially a cylindrical shape. A central axis of the cap 21 lies along the optical axis of the optical fiber 13. The cap 21 has a base end surface 21a and a distal end surface 21b arranged in the optical axis direction (that is, the direction D1) of the optical fiber 13. The base end surface 21a is fixed to the carrier mounting surface 25a of the plate-shaped member 25 with a toric flange member 26 therebetween. Specifically, the toric flange member 26 has one end surface 26a and the other end surface 26b arranged in the optical axis direction of the optical fiber 13. The base end surface 21a of the cap 21 is firmly attached (for example, resistance welding) to the one end surface 26a of the flange member 26. The carrier mounting surface 25a of the plate-shaped member 25 is firmly attached to the other end surface 26b of the flange member 26. Therefore, the cap 21 is provided on the carrier mounting surface 25a with the flange member 26 therebetween. The cap 21 covers (accommodates) the carrier block 24 and the end face emitting element 27, which will be described below. The cap 21 is inserted into the first part 15ca of the penetration hole 15c of the metal member 15 from the base end surface 15a side. Further, an outer circumferential surface 21d of the cap 21 is firmly attached to an inner surface of the first part 15ca. For example, the cap 21 is formed of a material such as an iron-nickel alloy.

The cap 21 further has a penetration hole 21c extending in the direction D1. The penetration hole 21c penetrates the cap 21 between the base end surface 21a and the distal end surface 21b in the direction D1. The penetration hole 21c includes a first part 21c a extending from the base end surface 21a to a portion in the middle of the penetration hole 21c, and a second part 21cb extending from the distal end surface 21b to the first part 21ca. An inner diameter of the first part 21ca is larger than an inner diameter of the second part 21cb. The second part 21cb functions as an optical window allowing signal light from the end face emitting element 27 to pass therethrough.

The carrier block 24 is mounted on the carrier mounting surface 25a of the plate-shaped member 25 and is fixed to the carrier mounting surface 25a. The carrier block 24 is accommodated inside the first part 21ca of the cap 21. The carrier block 24 is a rectangular parallelepiped member having a main surface and a side surface. In the carrier block 24, the end face emitting element 27 is mounted on the main surface of the carrier block 24. The side surface of the carrier block 24 faces the carrier mounting surface 25a. The carrier block 24 includes a block formed of a dielectric substance (for example, ceramic or quartz), and a plurality of wiring patterns formed on the block.

The end face emitting element 27 is an example of an optical semiconductor element according to the present embodiment. The end face emitting element 27 is optically coupled to the other end 13b of the optical fiber 13. The end face emitting element 27 outputs signal light toward the optical fiber connected to the optical receptacle 10. For example, the end face emitting element 27 may be an electro-absorption modulator integrated with a DFB laser (EML) having a configuration in which a laser diode and an electro-absorption optical modulator are monolithically integrated, or a directly modulated laser (DML).

The lens 23 is held by the cap 21 and is fixed to an inner circumferential surface of the second part 21c b. The lens 23 is a condensing lens constituted of a light transmissive member (for example, glass). The lens 23 is disposed on the optical axis of the end face emitting element 27 and the optical fiber 13. The lens 23 condenses signal light emitted from the end face emitting element 27 toward an area in the vicinity of the other end 13b of the optical fiber 13.

As illustrated in FIG. 2, the flexible substrate 28 is attached to the back surface 25b of the plate-shaped member 25. The flexible substrate 28 has a plurality of holes respectively corresponding to a plurality of terminals 29a, 29b, 29c, and 29d. The flexible substrate 28 is fixed to the plurality of terminals 29a, 29b, 29c, and 29d respectively inserted into the plurality of holes using a conductive joining material. The flexible substrate 28 further has a rigid portion 28e and a plurality of wiring patterns 28a, 28b, 28c, and 28d provided on the back surface 25b of the dielectric substrate 251 and extending from the plurality of holes to the rigid portion 28e. The wiring patterns 28a, 28b, 28c, and 28d are respectively conductively joined to the terminals 29a, 29b, 29c, and 29d. Moreover, the flexible substrate 28 has a wiring pattern 28f provided on the back surface 25b of the dielectric substrate 251 and conductively joined to the via 25i of dielectric substrate 251.

Figure 4:
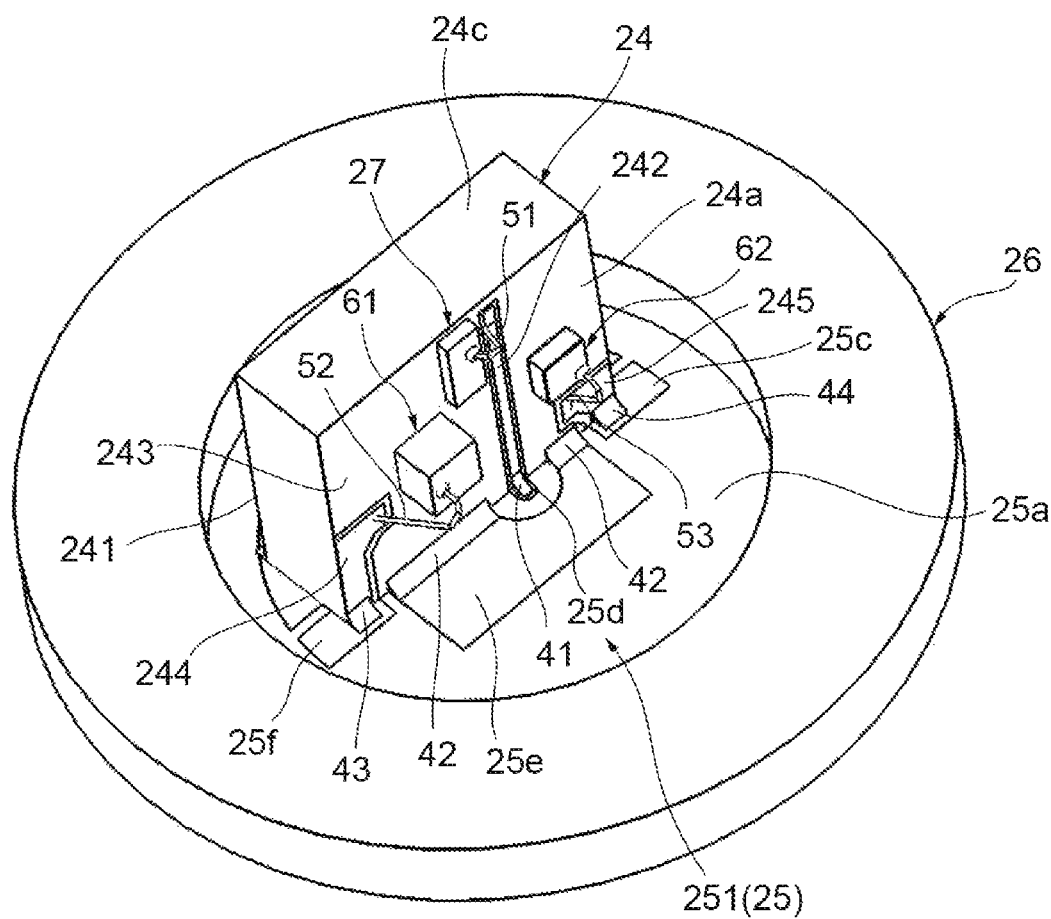
FIG. 4 is a perspective view illustrating a light emitting portion excluding a cap and a lens of the optical transmission module illustrated in FIG. 1 and illustrates an appearance including a main surface of a carrier block.
Figure 4:
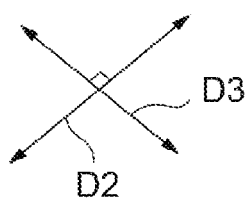
Figure 5:
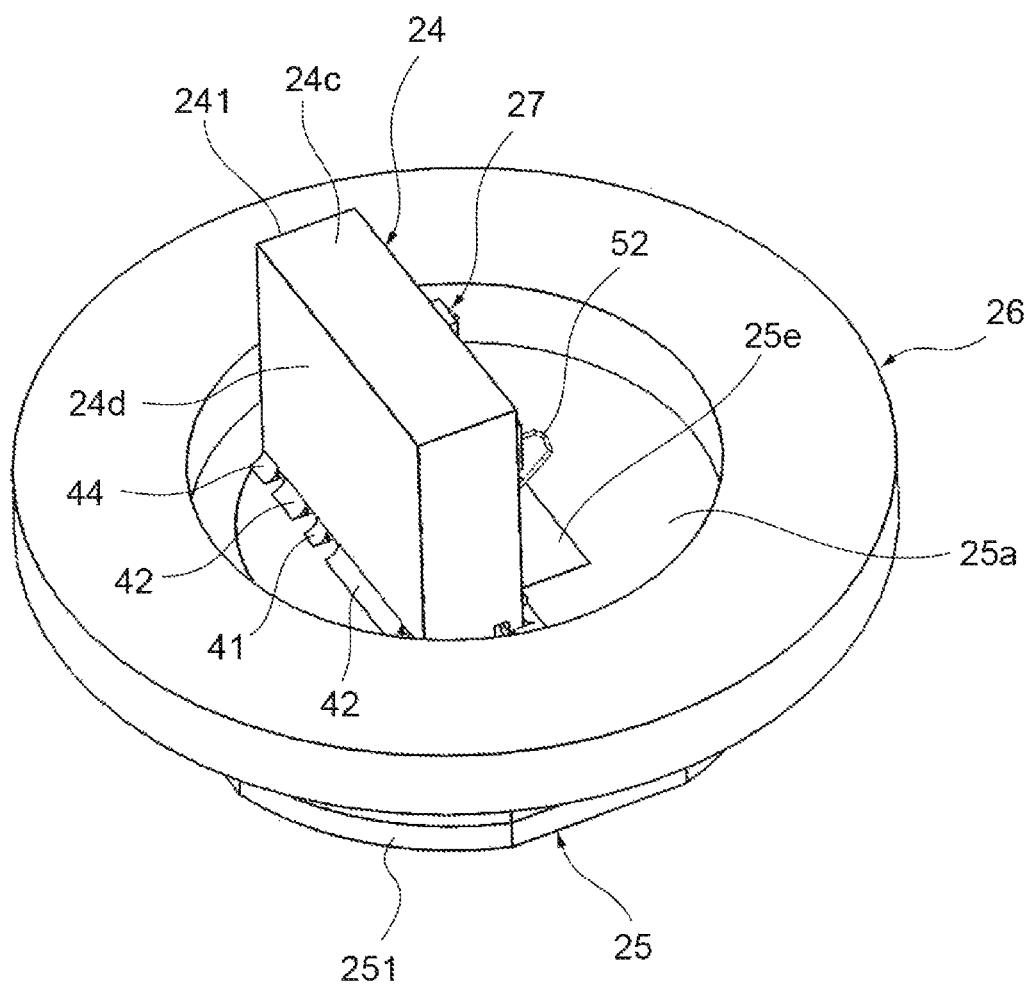
FIG. 5 is a perspective view illustrating the light emitting portion excluding a cap and a lens illustrated in FIG. 4 and illustrates an appearance including a back surface of the carrier block.
Figure 6:
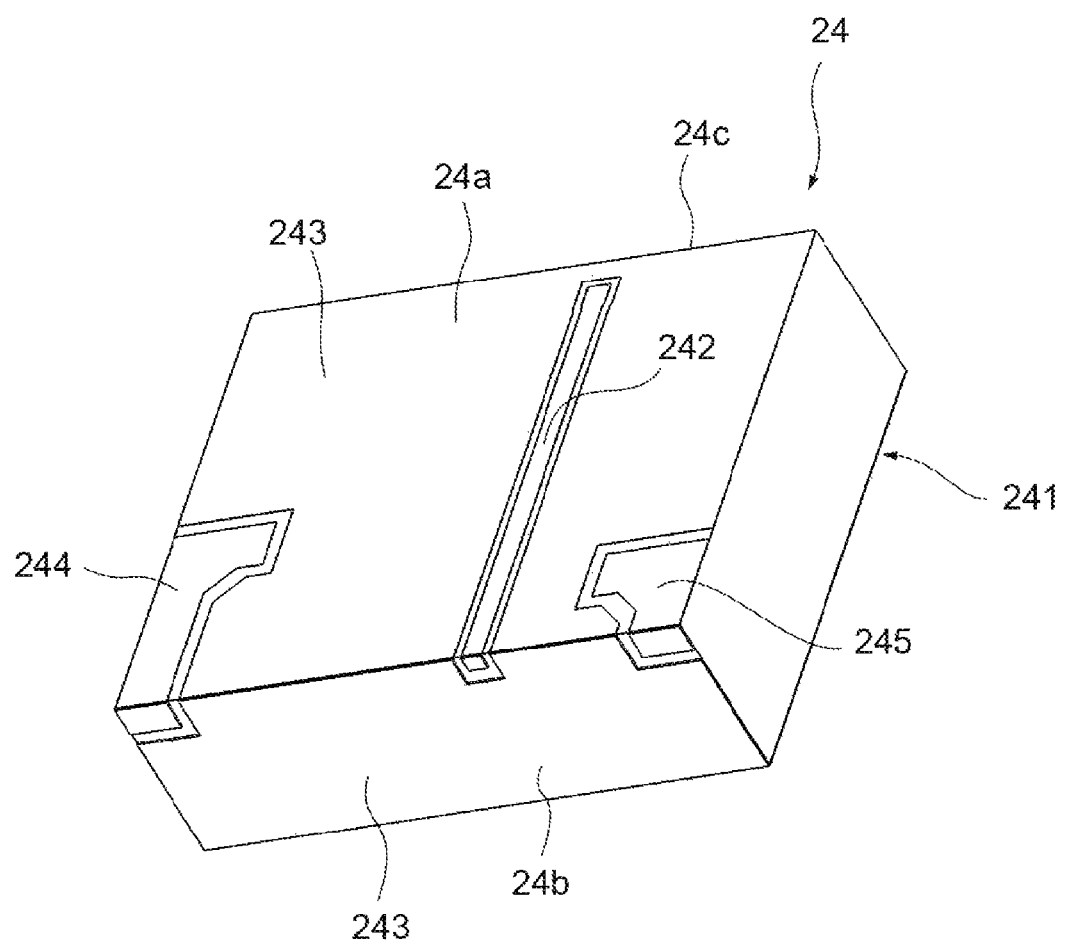
FIG. 6 is a perspective view illustrating an appearance of the carrier block.
Figure 7:
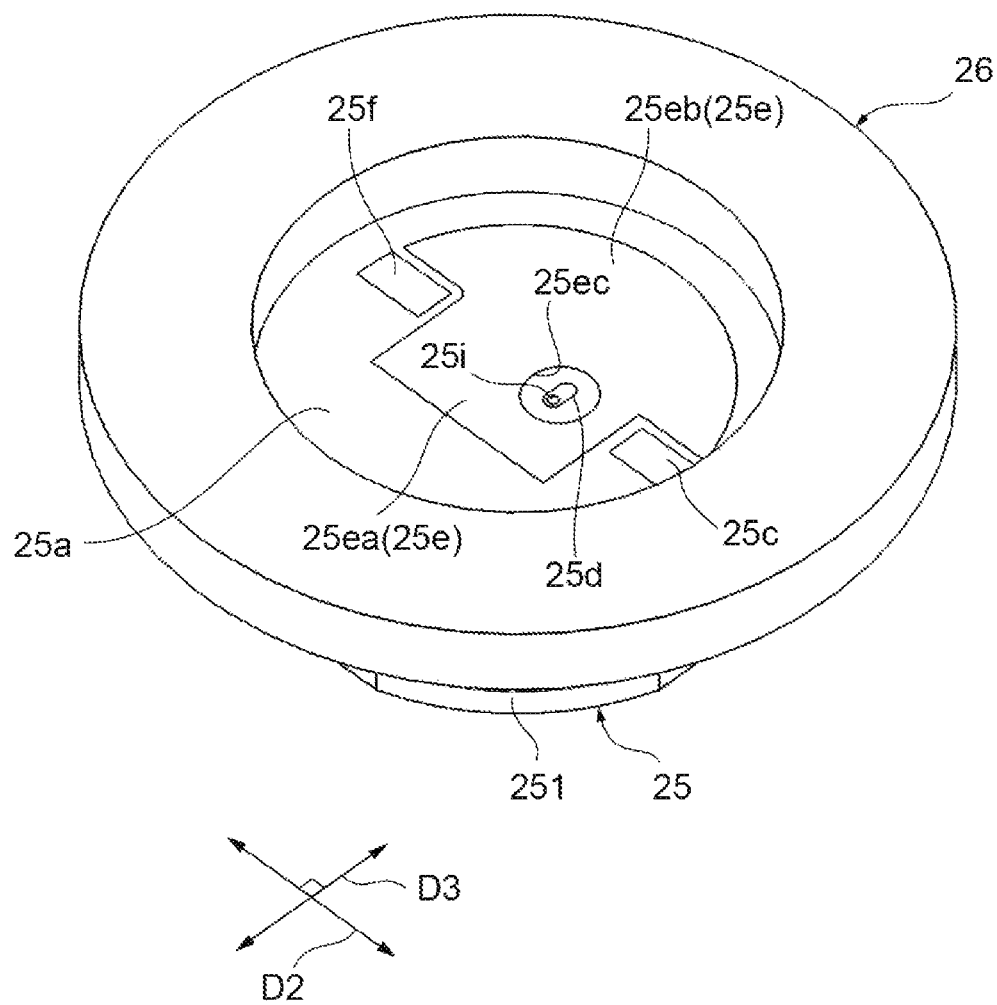
FIG. 7 is a perspective view illustrating a carrier mounting surface and a flange member of a plate-shaped member.
Figure 8:
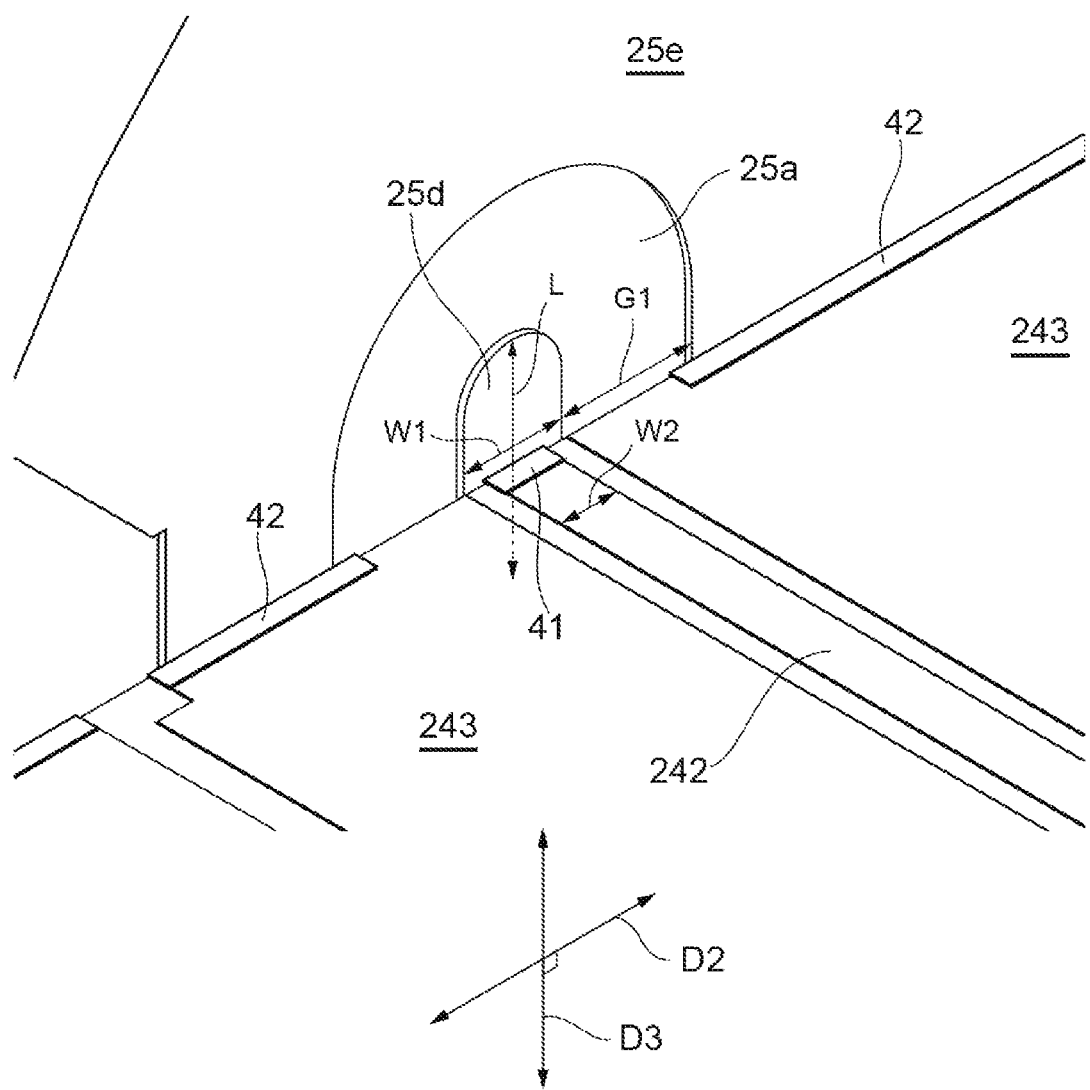
FIG. 8 is an enlarged perspective view illustrating an area in the vicinity of a joint portion between the carrier block and the carrier mounting surface.

FIGS. 4 and 5 are perspective views illustrating the light emitting portion 20 excluding the cap 21 and the lens 23. FIG. 4 illustrates an appearance including a main surface 24a of the carrier block 24. FIG. 5 illustrates an appearance including a back surface 24d of the carrier block 24. FIG. 6 is a perspective view illustrating an appearance of the carrier block 24. FIG. 7 is a perspective view illustrating the carrier mounting surface 25a of the plate-shaped member 25 and the flange member 26. FIG. 8 is an enlarged perspective view illustrating an area in the vicinity of a joint portion between the carrier block 24 and the carrier mounting surface 25a.

As illustrated in FIG. 7, the plate-shaped member 25 has wiring patterns 25c, 25d, and 25f constituted of a metal film and a reference potential pattern 25e constituted of a metal film in a region exposed from the flange member 26 on the carrier mounting surface 25a of the dielectric substrate 251. The wiring patterns 25c and 25f are respectively electrically connected to the terminals 29a and 29d inside the dielectric substrate 251 (refer to FIG. 2). The wiring pattern 25d is electrically connected to the via 25i penetrating the dielectric substrate 251. The reference potential pattern 25e is electrically connected to the terminal 29c inside the dielectric substrate 251 (refer to FIG. 2). For example, the wiring patterns 25c and 25f have a rectangular flat surface shape. A longitudinal direction of the flat surface shape thereof lies along a direction D2 along with the carrier mounting surface 25a. The wiring patterns 25c and 25f are disposed side by side in the direction D2. The wiring pattern 25d is an example of a first wiring pattern according to the present embodiment. The wiring pattern 25d is positioned between the wiring pattern 25c and the wiring pattern 25f in the direction D2. For example, the flat surface shape of the wiring pattern 25d has an oval shape or an elliptical shape having a direction D3 intersecting (for example, orthogonal to) the direction D2 as a long axis direction.

The reference potential pattern 25e is an example of a first reference potential pattern according to the present embodiment. The reference potential pattern 25e includes a first part 25ea and a second part 25eb. For example, the first part 25ea has a rectangular flat surface shape. A longitudinal direction of the flat surface shape thereof lies in the direction D2. The first part 25ea is positioned between the wiring pattern 25c and the wiring pattern 25f. The first part 25ea is adjacent to the wiring patterns 25c and 25f with a clearance therebetween in the direction D2. The first part 25ea includes a circular opening 25ec. The wiring pattern 25d is provided inside the opening 25ec. That is, the reference potential pattern 25e surrounds the wiring pattern 25d while being separated from the wiring pattern 25d. The second part 25eb is integrally constituted in a manner of being connected to the first part 25ea. The second part 25eb is positioned on one side in the direction D3 with respect to the first part 25ea and the wiring patterns 25c and 25f. The second part 25eb is adjacent to the wiring patterns 25c and 25f with a clearance therebetween in the direction D3. An outer edge of the second part 25eb lies along the flange member 26. The flat surface shape of the outer edge of the second part 25eb exhibits an arc shape (for example, a semicircular shape).

As illustrated in FIG. 4, the carrier block 24 is mounted on the carrier mounting surface 25a of the dielectric substrate 251. The carrier block 24 has a dielectric block 241. The dielectric block 241 exhibits a rectangular parallelepiped shape. As illustrated in FIG. 6, the dielectric block 241 has the flat main surface 24a and a pair of flat side surfaces 24b and 24c directed in directions opposite to each other. A normal direction of the main surface 24a and a normal direction of the side surfaces 24b and 24c intersect (for example, is orthogonal to) each other. A length of each side of the main surface 24a is larger than a thickness of the carrier block 24. It can also be said that the dielectric block 241 exhibits a flat plate shape. In a state in which the carrier block 24 is mounted on the carrier mounting surface 25a, the side surface 24b faces the carrier mounting surface 25a, and the main surface 24a extends in a direction intersecting the carrier mounting surface 25a. The carrier block 24 is disposed on the carrier mounting surface 25a in a direction in which the main surface 24a lies in the direction D2 (in other words, in a direction in which the normal direction of the main surface 24a lies in the direction D3).

The carrier block 24 has wiring patterns 242, 244, and 245 which are metal films provided on the main surface 24a of the dielectric block 241, and a reference potential pattern 243. The wiring patterns 242, 244, and 245 and the reference potential pattern 243 are metallized patterns realized through photolithography, for example. The wiring pattern 242 is an example of a second wiring pattern according to the present embodiment. The reference potential pattern 243 is an example of a second reference potential pattern according to the present embodiment. The wiring pattern 242 and the reference potential pattern 243 constitute coplanar lines. Specifically, the wiring pattern 242 is a wiring pattern having a long and thin shape extending in a direction intersecting the carrier mounting surface 25a on the main surface 24a (as an example, in a normal direction of the carrier mounting surface 25a). One end portion of the wiring pattern 242 extends to at least an end edge on the side surface 24b side in the main surface 24a. In the example illustrated in FIG. 6, the one end portion of the wiring pattern 242 extends from the main surface 24a to the side surface 24b. Further, as illustrated in FIGS. 4 and 8, the one end portion of the wiring pattern 242 is conductively joined to the wiring pattern 25d with a conductive joining material 41 therebetween. A width W1 of the wiring pattern 25d in the direction D2 may be larger than a width W2 of the wiring pattern 242 in a short direction. On the other hand, as illustrated in FIG. 4, the other end portion of the wiring pattern 242 is electrically connected to one electrode pad of the end face emitting element 27 via a bonding wire 51. For example, the electrode pad of the end face emitting element 27 is an anode electrode pad of an electro-absorption optical modulator or a directly modulated laser.

The reference potential pattern 243 is disposed on both sides of the wiring pattern 242. The reference potential pattern 243 is disposed with a uniform gap from the wiring pattern 242 in the longitudinal direction of the wiring pattern 242. As an example, the reference potential pattern 243 is provided on the entire surface of the main surface 24a except for the wiring pattern 242, a surrounding region of the wiring pattern 242, the wiring patterns 244 and 245 (which will be described below), and surrounding regions of the wiring patterns 244 and 245. Therefore, one end portion of the reference potential pattern 243 extends to at least the end edge on the side surface 24b side in the main surface 24a. In the example illustrated in FIG. 6, the one end portion of the reference potential pattern 243 extends from the main surface 24a to the side surface 24b. The reference potential pattern 243 on the side surface 24b is provided such that the one end portion of the wiring pattern 242 on the side surface 24b is surrounded from three sides. As an example, the reference potential pattern 243 is provided on the entire surface of the side surface 24b except for the wiring pattern 242, the surrounding region of the wiring pattern 242, the wiring patterns 244 and 245 (which will be described below), and the surrounding regions of the wiring patterns 244 and 245. Further, as illustrated in FIGS. 4 and 8, the reference potential pattern 243 is conductively joined to the reference potential pattern 25e with a conductive joining material 42 therebetween.

The wiring pattern 244 is a wiring pattern extending in a direction intersecting the carrier mounting surface 25a on the main surface 24a. The wiring pattern 244 is provided at a corner on the main surface 24a on the side surface 24b side. One end portion of the wiring pattern 244 extends to at least the end edge on the side surface 24b side in the main surface 24a. In the example illustrated in FIG. 6, the one end portion of the wiring pattern 244 extends from the main surface 24a to the side surface 24b. Further, as illustrated in FIG. 4, the one end portion of the wiring pattern 244 is conductively joined to the wiring pattern 25f with a conductive joining material 43 therebetween. On the other hand, as illustrated in FIG. 4, the other end portion of the wiring pattern 244 is electrically connected to one electrode of a by-pass capacitor 61 via a bonding wire 52. The by-pass capacitor 61 is mounted on the reference potential pattern 243 such that the other electrode of the by-pass capacitor 61 faces the reference potential pattern 243. The other electrode of the by-pass capacitor 61 is electrically connected to one electrode pad of the end face emitting element 27 via another bonding wire. For example, the electrode pad of the end face emitting element 27 is an anode electrode pad of the laser diode integrated with an absorption optical modulator. When the end face emitting element 27 is a directly modulated laser, the by-pass capacitor 61 may not be provided.

The wiring pattern 245 is a wiring pattern extending in a direction intersecting the carrier mounting surface 25a on the main surface 24a. The wiring pattern 245 is provided at a corner on the main surface 24a on the side surface 24b side (another corner different from that with the wiring pattern 244). One end portion of the wiring pattern 245 extends to at least the end edge on the side surface 24b side in the main surface 24a. In the example illustrated in FIG. 6, the one end portion of the wiring pattern 245 extends from the main surface 24a to the side surface 24b. Further, as illustrated in FIG. 4, the one end portion of the wiring pattern 245 is conductively joined to the wiring pattern 25c with a conductive joining material 44 therebetween. On the other hand, as illustrated in FIG. 4, the other end portion of the wiring pattern 245 is electrically connected to one electrode of a temperature detection element (thermistor) 62 via a bonding wire 53. The temperature detection element 62 is mounted on the reference potential pattern 243 such that the other electrode of the temperature detection element 62 faces the reference potential pattern 243.

Specific examples of the conductive joining materials 41, 42, 43, and 44 include solders (for example, AuSn solders or SuAgCu solders), and brazing material or adhesives such as metal pastes (for example, Au pastes or Ag pastes). The conductive joining materials 41, 42, 43, and 44 may be solder vapor-deposited films formed on the carrier block 24 side in advance, may be solder vapor-deposited films formed on the carrier mounting surface 25a side in advance, or may be spare solders provided on the carrier mounting surface 25a. The conductive joining materials 41, 43, and 44 are interposed between parts of the wiring patterns 242, 244, and 245 and the wiring patterns 25c, 25d, and 25f. The parts of the wiring patterns 242, 244, and 245 are provided on the side surface 24b. The conductive joining materials 41, 43, and 44 electrically connect the parts of the wiring patterns 242, 244, and 245 and the wiring patterns 25c, 25d, and 25f to each other. Further, the conductive joining materials 41, 43, and 44 firmly join the carrier block 24 and the plate-shaped member 25 to each other. The conductive joining materials 41, 43, and 44 form a fillet between parts of the wiring patterns 242, 244, and 245 and the wiring patterns 25c, 25d, and 25f. The parts of the wiring patterns 242, 244, and 245 are provided on the main surface 24a. The conductive joining materials 41, 43, and 44 electrically connect the parts of the wiring patterns 242, 244, and 245 and the wiring patterns 25c, 25d, and 25f. Further, the conductive joining materials 41, 43, and 44m ore firmly join the carrier block 24 and the plate-shaped member 25 to each other. As illustrated in FIG. 5, the conductive joining materials 41, 42, 43, and 44 lead to the back surface 24d of the carrier block 24 and also form a fillet between the back surface 24d of the carrier block 24 and the carrier mounting surface 25a.

A method for assembling the optical transmission module 1A of the present embodiment is as follows. First, the end face emitting element 27, the by-pass capacitor 61, and the temperature detection element 62 are mounted at predetermined positions on the carrier block 24. Next, the bonding wires 51, 52, and 53 are formed, and the end face emitting element 27, the by-pass capacitor 61, and the temperature detection element 62 are electrically connected to the carrier block 24. Subsequently, the carrier mounting surface 25a of the plate-shaped member 25 and the side surface 24b of the carrier block 24 are joined to each other with the conductive joining materials 41, 42, 43, and 44 therebetween. Further, the cap 21 with the lens 23 is subjected to resistance welding to the flange member 26, and thus the light emitting portion 20 is completed. Last, after the light emitting portion 20 and the optical receptacle 10 are aligned with each other, the light emitting portion 20 and the optical receptacle 10 are fixed to each other.

Effects achieved by the light emitting portion 20 of the present embodiment having the foregoing configuration will be described. In the light emitting portion 20, one end portions of the coplanar lines (that is, the wiring pattern 242 and the reference potential pattern 243) on the carrier block 24 extend to at least the end edge on the side surface 24b side in the main surface 24a. Further, the wiring pattern 242 and the reference potential pattern 243 are conductively joined to the wiring pattern 25d and the reference potential pattern 25e provided on the carrier mounting surface 25a of the dielectric substrate 251 respectively with the conductive joining materials 41 and 42 therebetween. Therefore, in the present embodiment, the coplanar lines on the carrier block 24 can be connected to the wiring pattern 25d and the reference potential pattern 25e in a configuration having a smaller inductance than that of the bonding wire. As a result, mismatching of a characteristic impedance is unlikely to occur. Moreover, according to the present embodiment, the bonding wires need only be simply replaced with the conductive joining materials 41 and 42. Therefore, compared to the structure disclosed in Japanese Unexamined Patent Publication No. 2013-021220, increase of a package in size can be curbed. As above, according to the light emitting portion 20 of the present embodiment, mismatching of a characteristic impedance can be reduced while increase of a package in size is curbed. Moreover, a wire bonding step can be omitted when the carrier block 24 is mounted on the carrier mounting surface 25a, and thus the number of steps can be reduced.

As in the present embodiment, each of the one end portions of the wiring pattern 242 and the reference potential pattern 243 may extend from the main surface 24a to the side surface 24b. In this case, the wiring pattern 242 and the reference potential pattern 243 on the side surface 24b of the carrier block 24 face the wiring pattern 25d and the reference potential pattern 25e on the carrier mounting surface 25a. Therefore, with the conductive joining materials 41 and 42 therebetween, the wiring pattern 25d and the wiring pattern 242 can be firmly joined to each other and the reference potential pattern 25e and the reference potential pattern 243 can be firmly joined to each other. Therefore, reliability of conductive joining between the wiring pattern 25d and the wiring pattern 242 and between the reference potential pattern 25e and the reference potential pattern 243 is enhanced, and joining strength between the carrier block 24 and the dielectric substrate 251 can be enhanced.

As in the present embodiment, the light emitting portion 20 may include a metal cap 21 with a window provided on the carrier mounting surface 25a of the dielectric substrate 251 and cover the carrier block 24 and the end face emitting element 27. In this case, the carrier block 24 and the end face emitting element 27 can be suitably protected.

As in the present embodiment, the light emitting portion 20 may include the via 25i electrically connected to the wiring pattern 25d and the wiring pattern 28f provided on the back surface 25b and penetrating the dielectric substrate 251 from the carrier mounting surface 25a to the back surface 25b, and the terminal 29c electrically connected to the reference potential pattern 25e and the wiring pattern 28c provided on the back surface 25b and penetrating the dielectric substrate 251 from the carrier mounting surface 25a to the back surface 25b. In this case, the coplanar lines on the carrier block 24 and the wiring patterns 28c and 28f connected to parts outside the light emitting portion 20 can be connected to each other in a configuration having a smaller inductance than that of the bonding wire.

Figure 9:
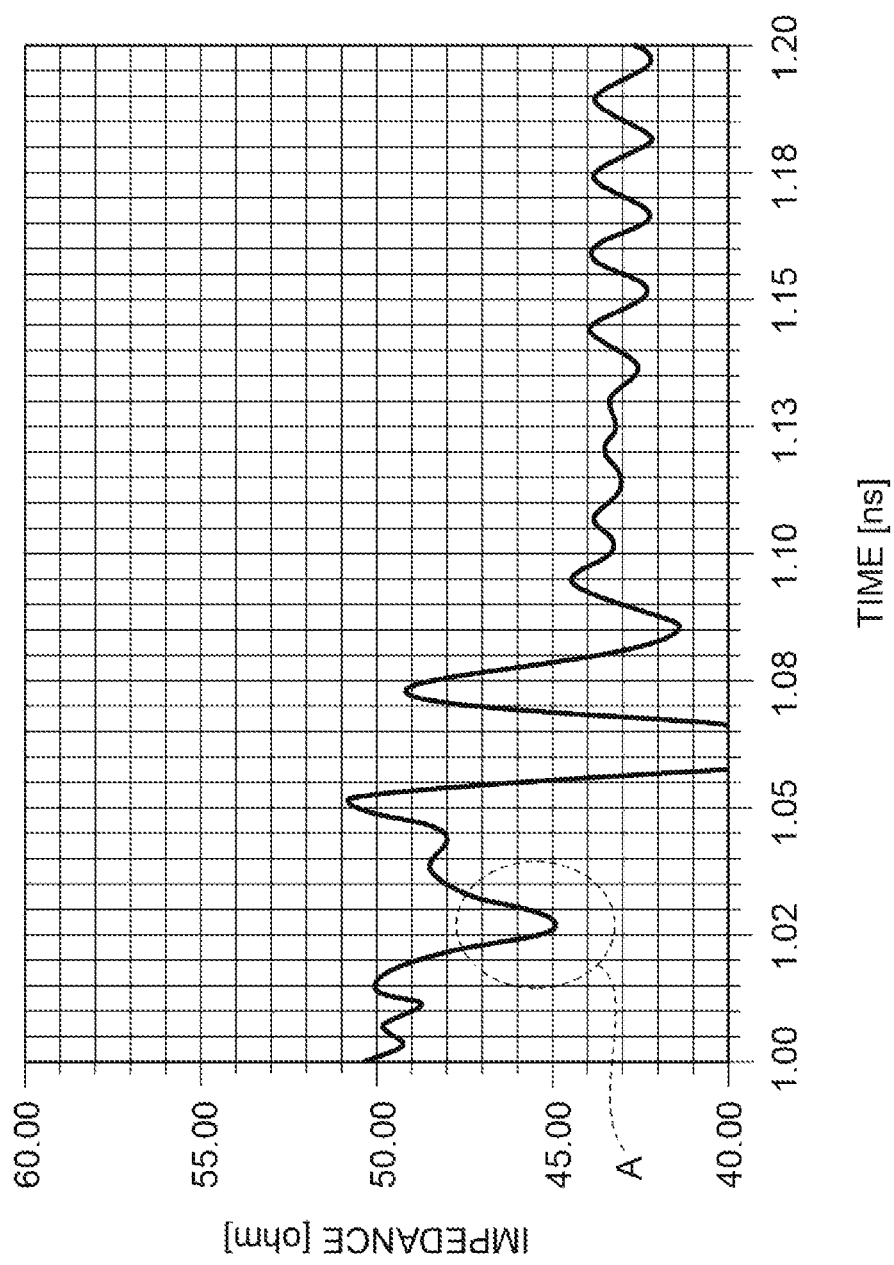
FIG. 9 is a graph illustrating results of measuring an impedance at each position in a transmission direction using a TDR method regarding a signal transmission line in the light emitting portion of the embodiment.

Here, the inventor has measured an impedance at each position in a transmission direction on a signal transmission line in the light emitting portion 20 of the present embodiment using a time domain reflecrometry (TDR) method. A TDR method is a method of measuring an impedance at each position in the transmission direction by inputting a pulse signal to a transmission line which becomes a measurement target and capturing reflected waves thereof using an oscilloscope. In this measurement, the width W1 of the wiring pattern 25d in the direction D2 (refer to FIG. 8) was set to 135 μm, a gap G1 between the wiring pattern 25d and the reference potential pattern 25e was set to 185 μm, and a length L of the wiring pattern 25d in the direction D3 was set to 250 μm. FIG. 9 is a graph illustrating measurement results. In FIG. 9, the vertical axis indicates impedance (unit: Ω), and the horizontal axis indicates time (unit: nanosecond). On the basis of this graph, it is possible to know an impedance of the transmission line with respect to a design impedance (50Ω). Moreover, on the basis of information of times, it is possible to know a position (distance) where each impedance occurs. Therefore, a place having significant mismatching of a characteristic impedance can be identified.

With reference to FIG. 9, in a joint part between the wiring pattern 25d and the wiring pattern 242 on the transmission line (part A in FIG. 9), it is clear that a reduced amount of the impedance is controlled to approximately 10 percent (5Ω) of the design impedance (50Ω). That is, according to the present embodiment, reduction in impedance of the joint part between the wiring pattern 25d and the wiring pattern 242 can be curbed, and thus mismatching of a characteristic impedance can be reduced.

FIRST MODIFICATION EXAMPLE

Figure 10:
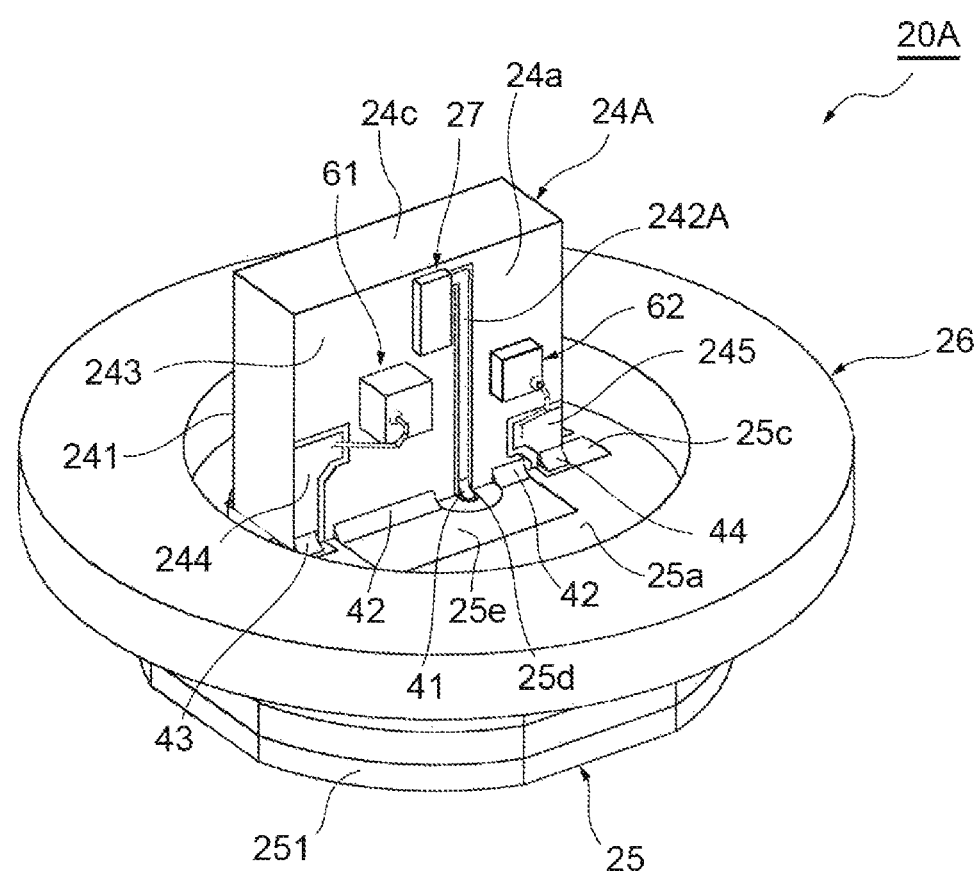
FIG. 10 is a perspective view illustrating a configuration of a light emitting portion according to a first modification example in which illustration of a cap and a lens is omitted.

FIG. 10 is a perspective view illustrating a configuration of a light emitting portion 20A according to a first modification example of the foregoing embodiment, in which illustration of the cap 21 and the lens 23 is omitted. As illustrated in FIG. 10, in place of the carrier block 24 of the foregoing embodiment, the light emitting portion 20A of the present modification example includes a carrier block 24A. The carrier block 24A of the present modification example and the carrier block 24 of the foregoing embodiment differ from each other in a method of connecting the wiring patterns constituting the coplanar lines and the end face emitting element 27 to each other.

In place of the wiring pattern 242 of the foregoing embodiment, the carrier block 24A of the present modification example has a wiring pattern 242A. The wiring pattern 242A is an example of the second wiring pattern in the present modification example. The wiring pattern 242A constitutes a coplanar line together with the reference potential pattern 243 provided on both sides of the wiring pattern 242A with a gap therebetween. Similar to the foregoing embodiment, one end portion of the wiring pattern 242A extends to at least the end edge on the side surface 24b side in the main surface 24a, and it extends from the main surface 24a to the side surface 24b as an example. Further, the one end portion of the wiring pattern 242A is conductively joined to the wiring pattern 25d on the carrier mounting surface 25a with the conductive joining material 41 therebetween.

The other end portion of the wiring pattern 242A extends to a part immediately below the end face emitting element 27 (in other words, between the end face emitting element 27 and the main surface 24a) and is conductively joined to a back electrode of the end face emitting element 27 with a conductive joining material therebetween. For example, the back electrode of the end face emitting element 27 is an anode electrode of an electro-absorption optical modulator or a directly modulated laser.

In this manner, the other end portion of the wiring pattern 242A constituting a coplanar line may extend to a part immediately below the end face emitting element 27 or may be conductively joined to the back electrode of the end face emitting element 27 with a conductive joining material therebetween. In this case, compared to a case in which the wiring pattern 242 and the end face emitting element 27 are connected to each other using the bonding wire 51 as in the foregoing embodiment, an inductance between the coplanar line and the end face emitting element 27 can be reduced. Therefore, mismatching of a characteristic impedance can be further reduced.

SECOND MODIFICATION EXAMPLE

Figure 11:
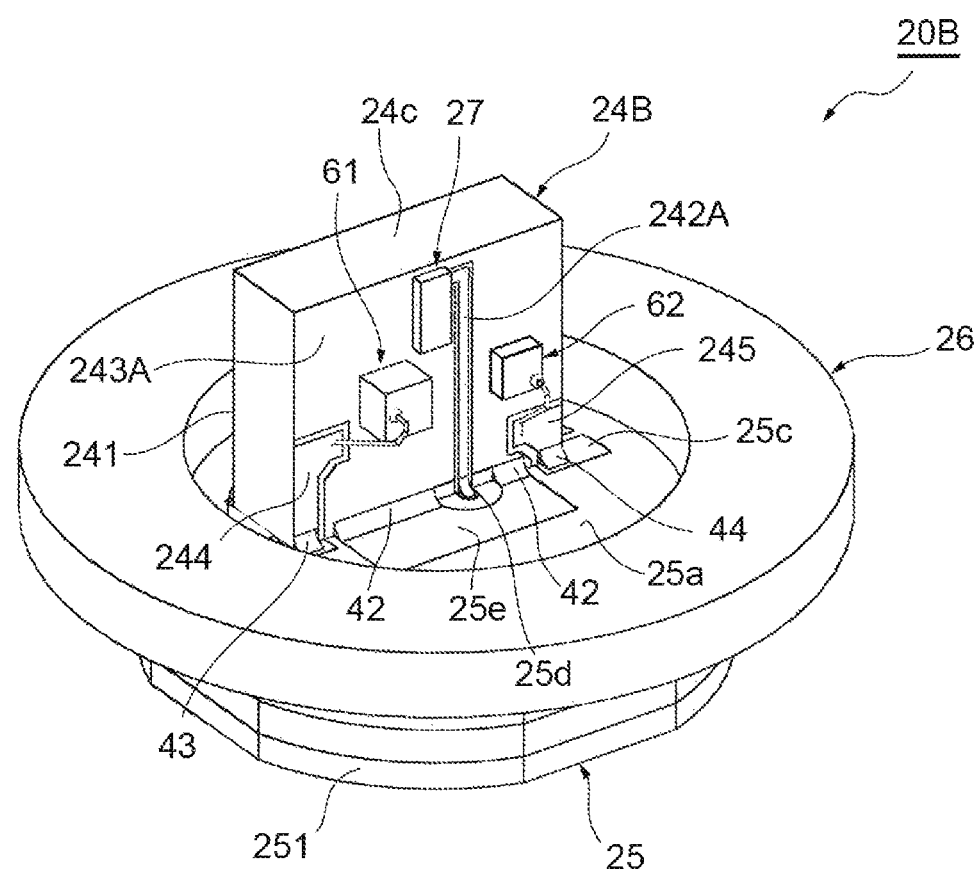
FIG. 11 is a perspective view illustrating a configuration of a light emitting portion according to a second modification example in which illustration of a cap and a lens is omitted.
Figure 12:
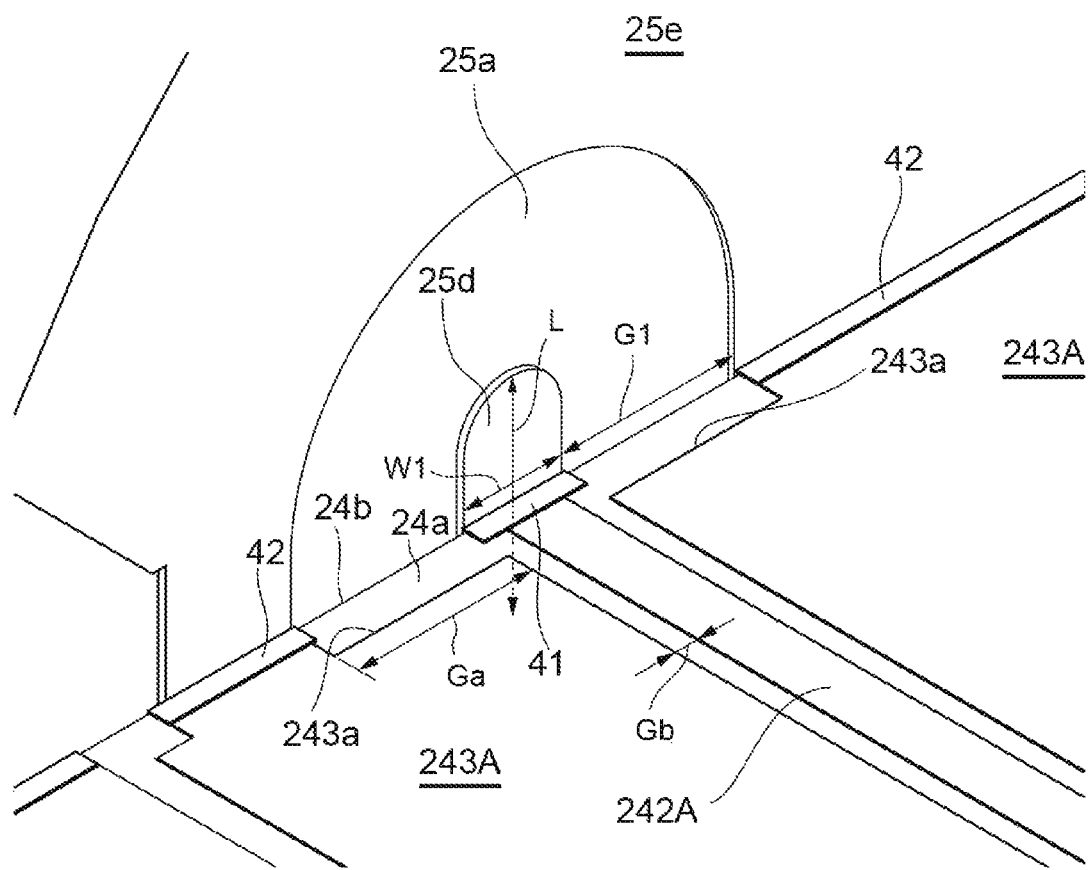
FIG. 12 is an enlarged perspective view illustrating an area in the vicinity of a joint portion between the carrier block and the carrier mounting surface.

FIG. 11 is a perspective view illustrating a configuration of a light emitting portion 20B according to a second modification example of the foregoing embodiment, in which illustration of the cap 21 and the lens 23 is omitted. As illustrated in FIG. 11, in place of the carrier block 24 of the foregoing embodiment, the light emitting portion 20B of the present modification example includes a carrier block 24B. In place of the wiring pattern 242 and the reference potential pattern 243 of the foregoing embodiment, the carrier block 24B has the wiring pattern 242A and a reference potential pattern 243A. FIG. 12 is an enlarged perspective view illustrating an area in the vicinity of a joint portion between the carrier block 24B and the carrier mounting surface 25a. The carrier block 24B of the present modification example and the carrier block 24 of the foregoing embodiment differ from each other in that similar to the first modification example as illustrated in FIG. 11, the other end portion of the wiring pattern 242A extends to a part immediately below the end face emitting element 27 and as illustrated in FIG. 12, a gap between one end portion of the reference potential pattern 243A and one end portion of the wiring pattern 242A on the main surface 24a is larger than a gap between the remaining portion of the reference potential pattern 243A and the remaining portion of the wiring pattern 242A on the main surface 24a.

For more specific description, as illustrated in FIG. 12, a side edge in the reference potential pattern 243A facing the wiring pattern 242A has a step 243a in a region near the side surface 24b on the main surface 24a. Further, a gap Ga between the reference potential pattern 243A and the wiring pattern 242A positioned between the step 243a and the side surface 24b is larger than a gap Gb between the reference potential pattern 243A and the wiring pattern 242A positioned on a side opposite to the side surface 24b when viewed from the step 243a. As an example, the gap Ga is seven times to nine times the gap Gb. For example, the gap Ga is 245 μm. In the present modification example, the gap G1 between the wiring pattern 25d and the reference potential pattern 25e (refer to FIG. 8) may be set to coincide with the gap Ga.

Figure 13:
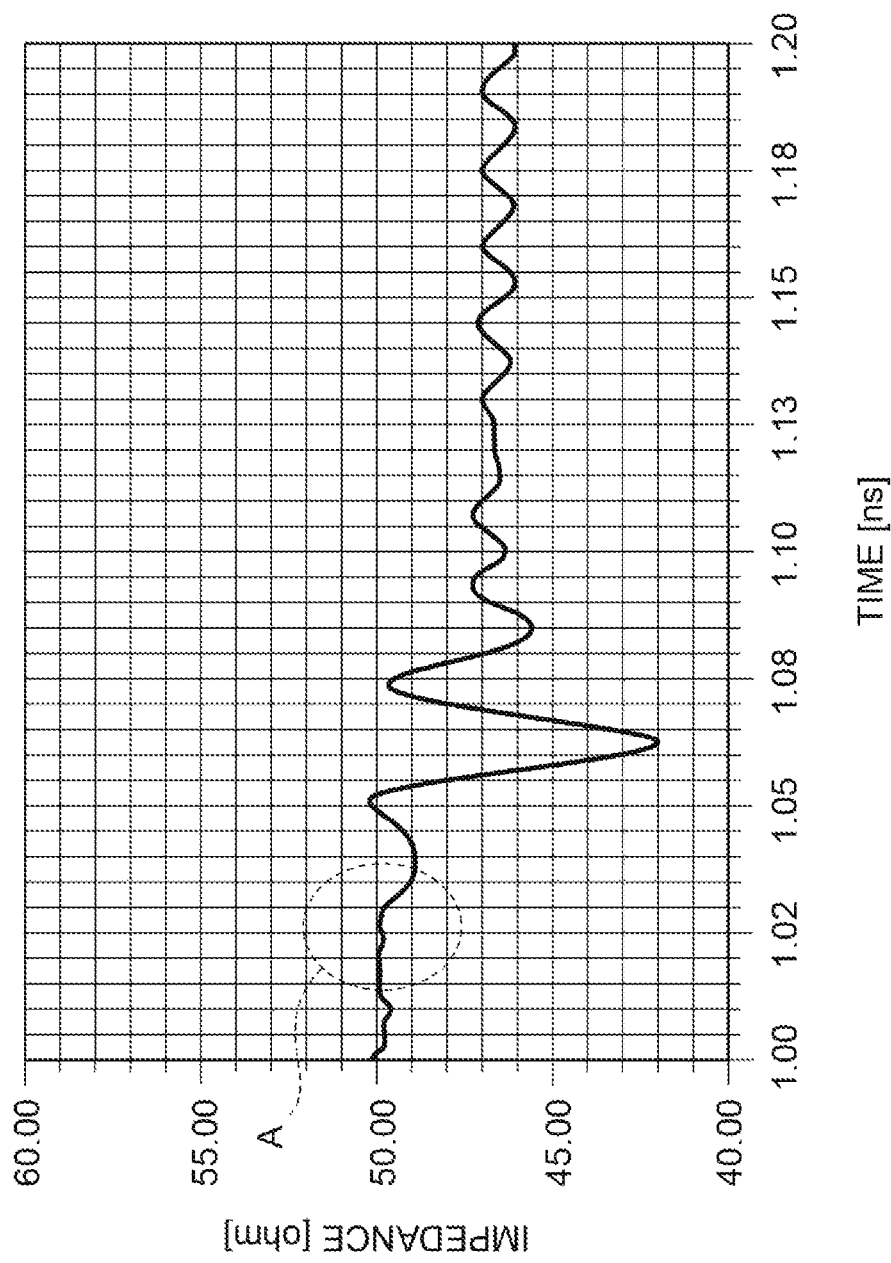
FIG. 13 is a graph illustrating results of measuring an impedance at each position in the transmission direction using a TDR method regarding a signal transmission line in a light emitting portion of the second modification example.

The inventor has measured an impedance at each position in the transmission direction on the signal transmission line in the light emitting portion 20B of the present modification example using a TDR method. In this measurement, the width W1 of the wiring pattern 25d in the direction D2 (refer to FIG. 8) was set to 135 μm, the gap G1 and the gap Ga were set to 245 μm, and the length L of the wiring pattern 25d in the direction D3 was set to 250 μm. FIG. 13 is a graph illustrating measurement results. In FIG. 13, the vertical axis indicates impedance (unit: Ω), and the horizontal axis indicates time (unit: nanosecond). With reference to FIG. 13, in the joint part between the wiring pattern 25d and the wiring pattern 242A on the transmission line (part A in FIG. 13), it is clear that a reduced amount of the impedance is controlled to be extremely smaller (1 percent or less) than the design impedance (50Ω). That is, according to the present modification example, reduction in impedance of the joint part between the wiring pattern 25d and the wiring pattern 242A can be further curbed, and thus mismatching of a characteristic impedance can be more effectively reduced.

THIRD MODIFICATION EXAMPLE

Figure 14:
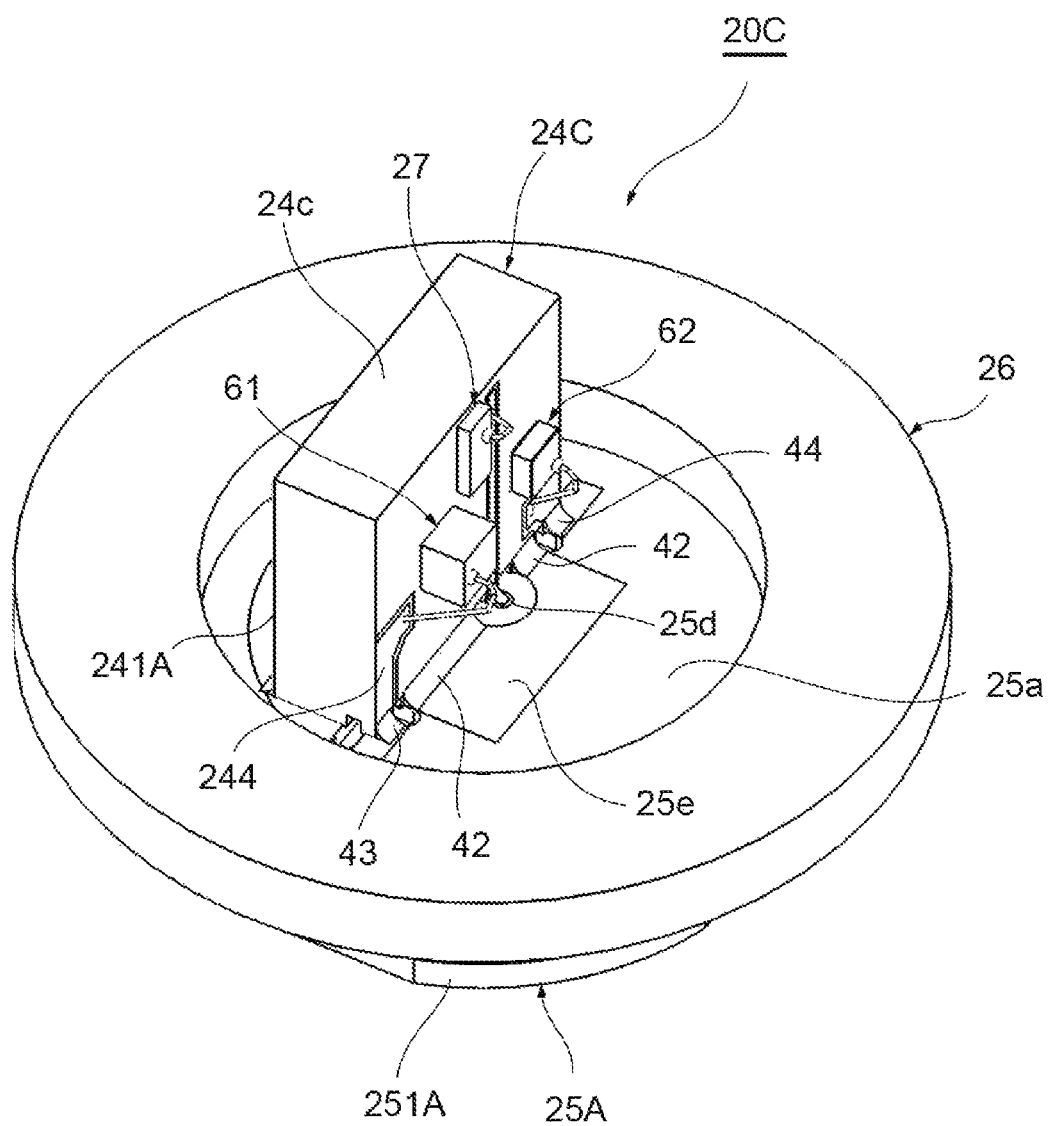
FIG. 14 is a perspective view illustrating a configuration of a light emitting portion according to a third modification example in which illustration of a cap and a lens is omitted.
Figure 15:
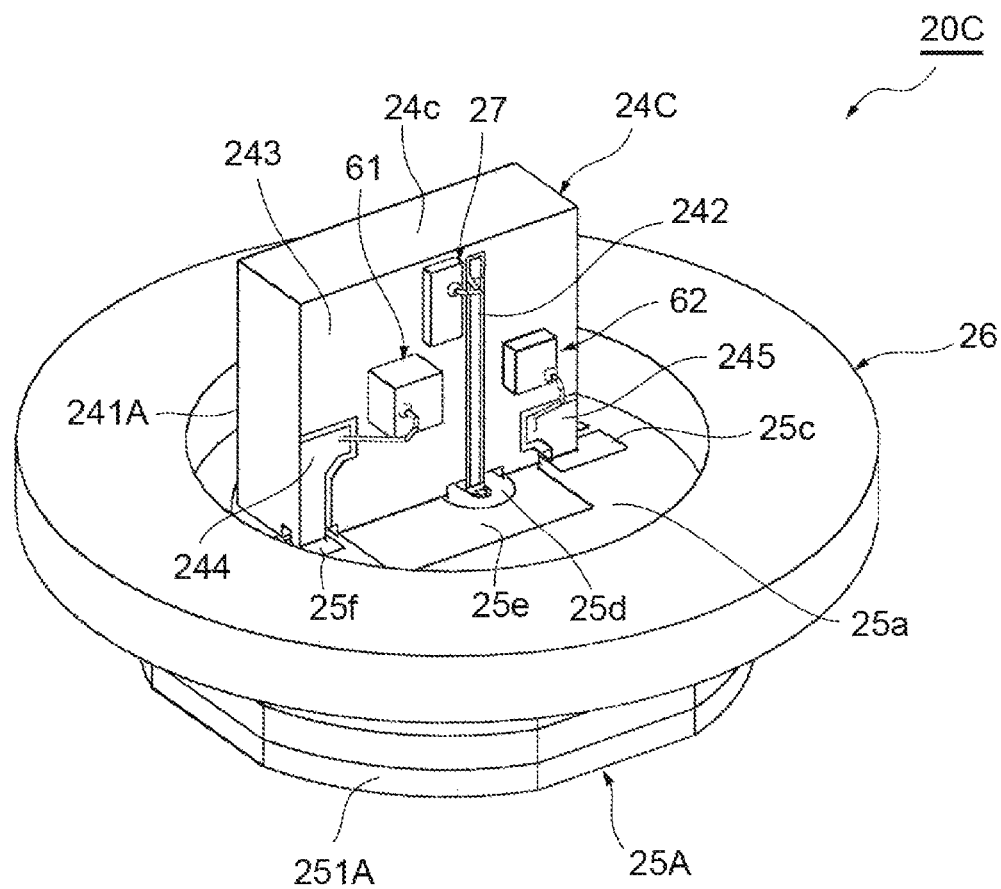
FIG. 15 is a view in which conductive joining materials are also omitted in FIG. 14.

FIG. 14 is a perspective view illustrating a configuration of a light emitting portion 20C according to a third modification example of the foregoing embodiment, in which illustration of the cap 21 and the lens 23 is omitted. FIG. 15 is a view in which the conductive joining materials 41, 42, 43, and 44 are also omitted in FIG. 14. As illustrated in FIGS. 14 and 15, in place of the carrier block 24 of the foregoing embodiment, the light emitting portion 20C of the present modification example includes the carrier block 24C. In place of the dielectric block 241 of the foregoing embodiment, the carrier block 24C has a dielectric block 241A. Moreover, in place of the plate-shaped member 25 of the foregoing embodiment, the light emitting portion 20C of the present modification example includes a plate-shaped member 25A. In place of the dielectric substrate 251 of the foregoing embodiment, the plate-shaped member 25A has a dielectric substrate 251A.

Figure 16:
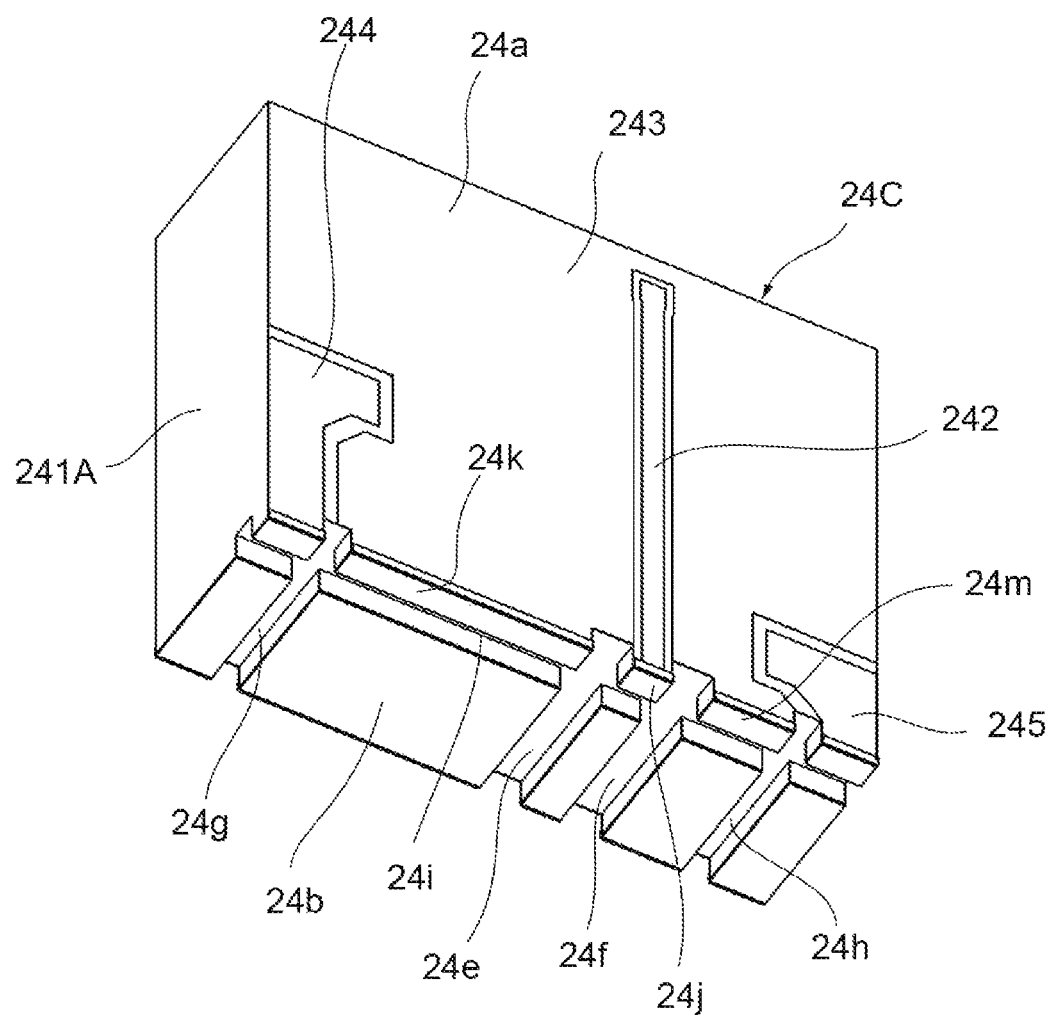
FIG. 16 is a perspective view illustrating an appearance of a carrier block of the third modification example.

FIG. 16 is a perspective view illustrating an appearance of the carrier block 24C of the present modification example. As illustrated in FIG. 16, the dielectric block 241A has grooves 24e, 24f, 24g, 24h, and 24i on the side surface 24b. For example, each of the grooves 24e, 24f, 24g, 24h, and 24i is a groove having a rectangular cross-sectional shape and is formed by digging the side surface 24b. A depth of each of the grooves 24e, 24f, 24g, 24h, and 24i may be smaller than a width of each of the grooves 24e, 24f, 24g, 24h, and 24i. Each of the grooves 24e, 24f, 24g, and 24h linearly extends in a thickness direction of the dielectric block 241A and leads to the back surface 24d from the main surface 24a. The groove 24i linearly extends in a direction along the main surface 24a of the dielectric block 241A and leads to the other side surface from one side surface of the dielectric block 241A in the same direction. Therefore, the groove 24i intersects each of the grooves 24e, 24f, 24g, and 24h.

The grooves 24e and 24f are first grooves in the present modification example. The groove 24e is provided on the side surface 24b between the reference potential pattern 243 and the wiring pattern 242 positioned on one side of the wiring pattern 242. The groove 24e divides the side surface 24b in a direction along the main surface 24a. Similarly, the groove 24f is provided on the side surface 24b between the reference potential pattern 243 and the wiring pattern 242 positioned on the other side of the wiring pattern 242. The groove 24f divides the side surface 24b in a direction along the main surface 24a. Since the grooves 24e and 24f penetrate the main surface 24a, the grooves 24e and 24f widen the gap between the one end portion of the reference potential pattern 243 and the one end portion of the wiring pattern 242 on the main surface 24a. That is, similar to the second modification example, the gap between the one end portion of the reference potential pattern 243 and the one end portion of the wiring pattern 242 on the main surface 24a is larger than the gap between the remaining portion of the reference potential pattern 243 and the remaining portion of the wiring pattern 242 on the main surface 24a.

The groove 24g is provided on the side surface 24b between the reference potential pattern 243 and the wiring pattern 244. The groove 24g divides the side surface 24b in a direction along the main surface 24a. The groove 24h is provided on the side surface 24b between the reference potential pattern 243 and the wiring pattern 245. The groove 24h divides the side surface 24b in a direction along the main surface 24a.

The groove 24i is a second groove in the present modification example. The groove 24g divides the side surface 24b in a direction intersecting the main surface 24a. Further, the reference potential pattern 243 and the wiring pattern 242 are positioned in a region on one side (that is, main surface 24a side) sandwiching the groove 24i. Metal films similar to the reference potential pattern 243 and the wiring pattern 242 may also be provided in a region on the other side sandwiching the groove 24i (that is, the back surface 24d side).

A projection portion 24j is formed on the side surface 24b due to the grooves 24e, 24f, and 24i. The one end portion of the wiring pattern 242 is provided on the projection portion 24j. A projection portion 24k is formed on the side surface 24b due to the grooves 24e, 24g, and 24i, and a projection portion 24m is formed on the side surface 24b due to the grooves 24f, 24h, and 24i. The one end portion of the reference potential pattern 243 is provided on the projection portions 24k and 24m.

Figure 17:
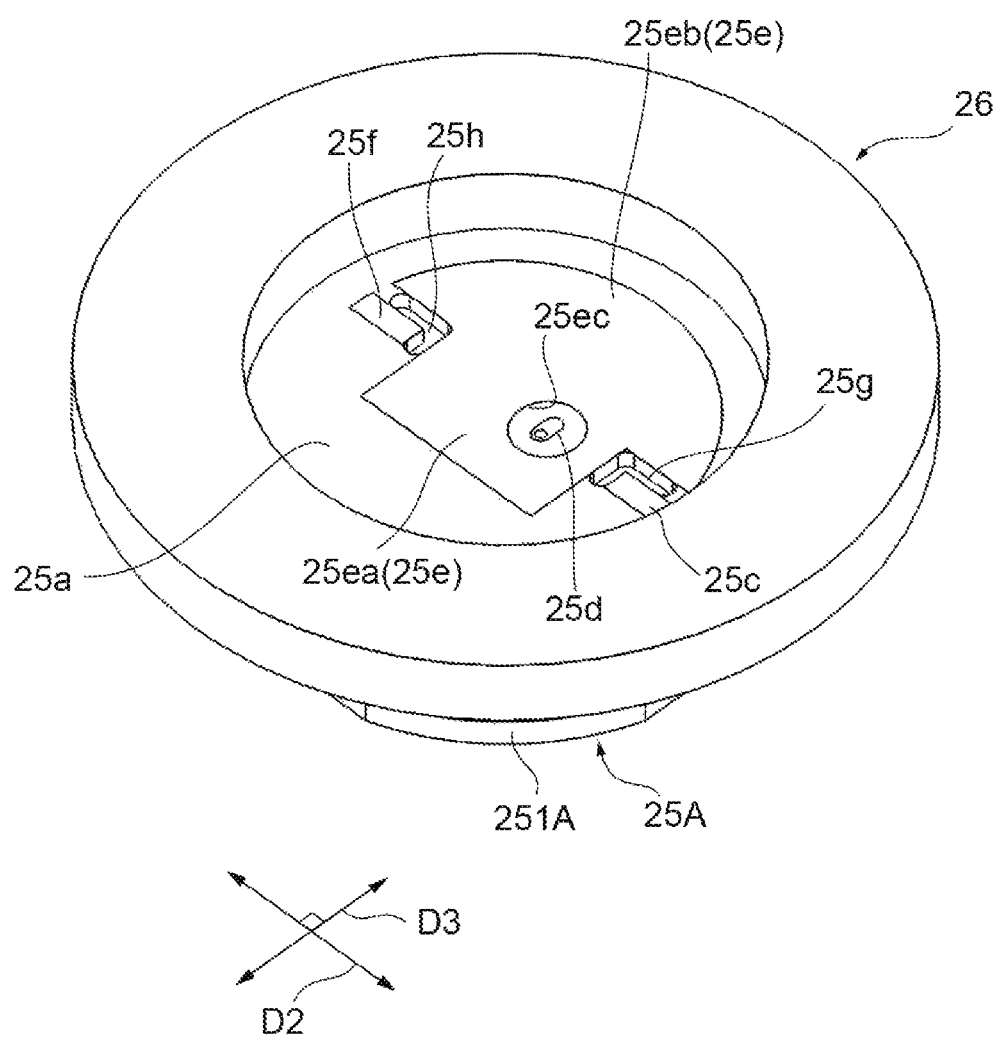
FIG. 17 is a perspective view illustrating a plate-shaped member and a flange member of the third modification example.

FIG. 17 is a perspective view illustrating the plate-shaped member 25A and the flange member 26 of the present modification example. The plate-shaped member 25A of the present modification example has grooves 25g and 25h on the carrier mounting surface 25a in addition to the configuration of the plate-shaped member 25 of the foregoing embodiment. For example, each of the grooves 25g and 25h is a groove having a rectangular cross-sectional shape and is formed by removing one layer (or a plurality of layers) of layers on the outermost surface of laminated ceramic. The groove 25g is provided between the wiring pattern 25c and the reference potential pattern 25e. In the example illustrated in FIG. 17, the groove 25g extends in an L-shape along with the shape of a clearance between the wiring pattern 25c and the reference potential pattern 25e. The groove 25h is provided between the wiring pattern 25f and the reference potential pattern 25e. In the example illustrated in FIG. 17, the groove 25h extends in an L-shape along with the shape of a clearance between the wiring pattern 25f and the reference potential pattern 25e.

Figure 18:
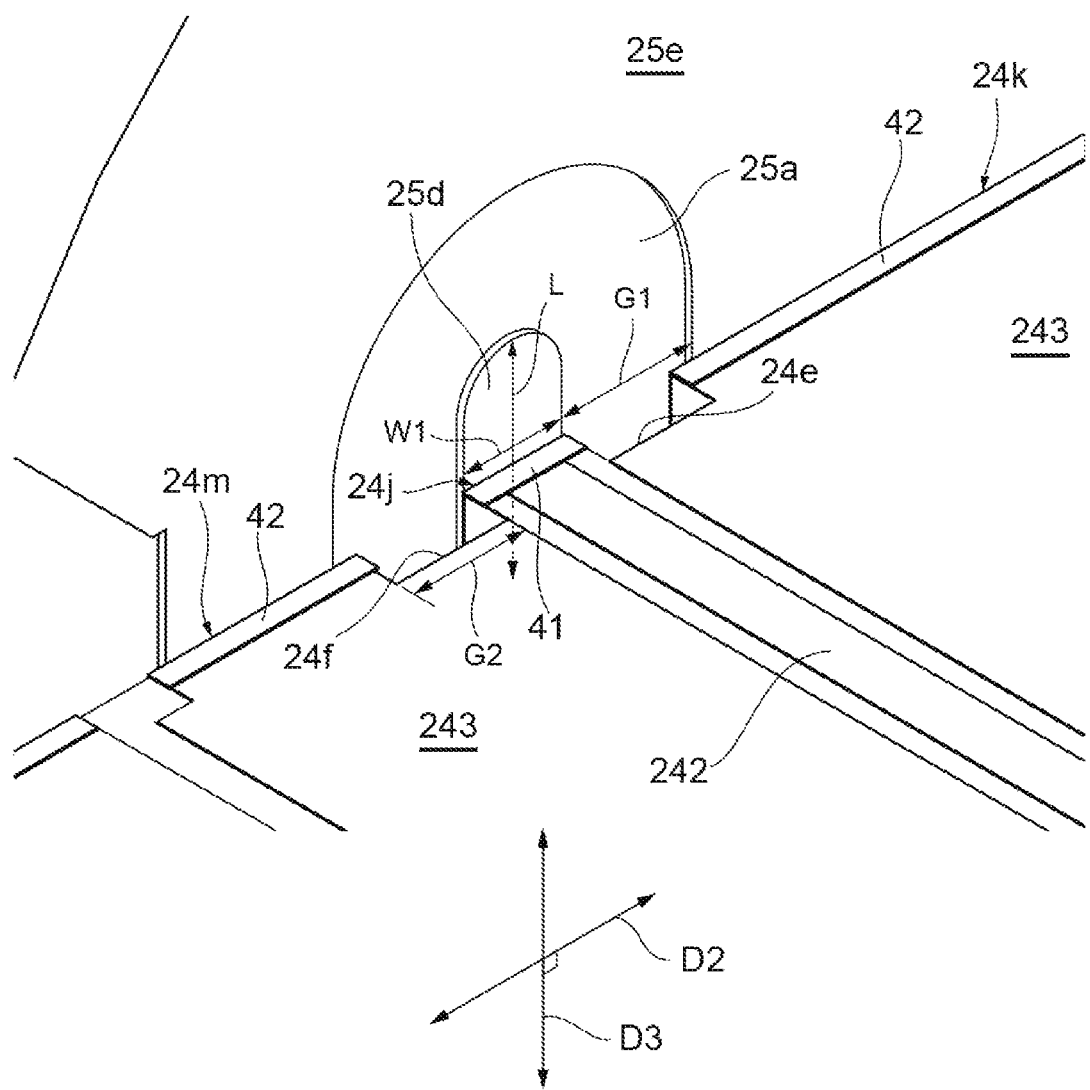
FIG. 18 is an enlarged perspective view illustrating an area in the vicinity of a joint portion between the carrier block and the carrier mounting surface.

FIG. 18 is an enlarged perspective view illustrating an area in the vicinity of a joint portion between the carrier block 24C and the carrier mounting surface 25a. As illustrated in FIG. 18, a width G2 of each of the grooves 24e and 24f may be smaller than the gap G1 between the wiring pattern 25d and the reference potential pattern 25e. A width of the projection portion 24j in the direction D2 may coincide with the width W1 of the wiring pattern 25d in the direction D2.

As in the present modification example, the carrier block 24C may have the grooves 24e and 24f provided between the reference potential pattern 243 and the wiring pattern 242 on the side surface 24b. In this case, the conductive joining material 41 between the wiring pattern 25d and the wiring pattern 242 can be more reliably isolated from the conductive joining material 42 between the reference potential pattern 25e and the reference potential pattern 243 (that is, a flow can be stopped) over the grooves 24e and 24f. Thus a risk of a short circuiting the wiring patterns 25d and 242 to the reference potential patterns 25e and 243 can be reduced. Moreover, as in the present modification example, the carrier block 24C may further have the groove 24i provided on the side surface 24b, and the reference potential pattern 243 and the wiring pattern 242 may be positioned in one region sandwiching the groove 24i. Accordingly, a risk of a short circuiting the wiring patterns 25d and 242 to the reference potential patterns 25e and 243 can be further reduced.

As in the present modification example, the carrier block 24C may have the grooves 24g and 24h provided between the reference potential pattern 243 and the wiring patterns 244 and 245 on the side surface 24b. In this case, the conductive joining materials 43 and 44 between the wiring patterns 25c and 25f and the wiring patterns 244 and 245 can be more reliably isolated from the conductive joining material 42 between the reference potential pattern 25e and the reference potential pattern 243 (that is, a flow can be stopped) over the grooves 24g and 24h. Thus a risk of a short circuiting the wiring patterns 25c, 25f, 244, and 245 to the reference potential patterns 25e and 243 can be reduced.

As in the present modification example, the plate-shaped member 25A may have the grooves 25g and 25h provided between the reference potential pattern 25e and the wiring patterns 25c and 25f on the carrier mounting surface 25a. In this case, the conductive joining materials 43 and 44 between the wiring patterns 25c and 25f and the wiring patterns 244 and 245 can be more reliably isolated from the conductive joining material 42 between the reference potential pattern 25e and the reference potential pattern 243 (that is, a flow can be stopped) over the grooves 25g and 25h. Thus a risk of a short circuiting the wiring patterns 25c, 25f, 244, and 245 to the reference potential patterns 25e and 243 can be further reduced.

In the foregoing embodiment, the wiring patterns 242, 244, and 245 and the reference potential pattern 243 on the main surface 24a and the side surface 24b are metallized patterns realized through photolithography. However, in the present modification example, the wiring patterns 242, 244, and 245 and the reference potential pattern 243 may be formed by forming the grooves 24e, 24f, 24g, and 24i through half-dicing and dividing a metallized film after the metallized film is formed on the entire surface of the side surface 24b.

A dielectric constant of air filling the grooves 24e, 24f, and 24i is smaller than a dielectric constant of the dielectric block 241A (for example, ceramic). Hence, a parasitic capacitance between the wiring pattern 242 and the reference potential pattern 243 becomes smaller, and thus high-frequency transmission characteristics can be further improved.

Figure 19:
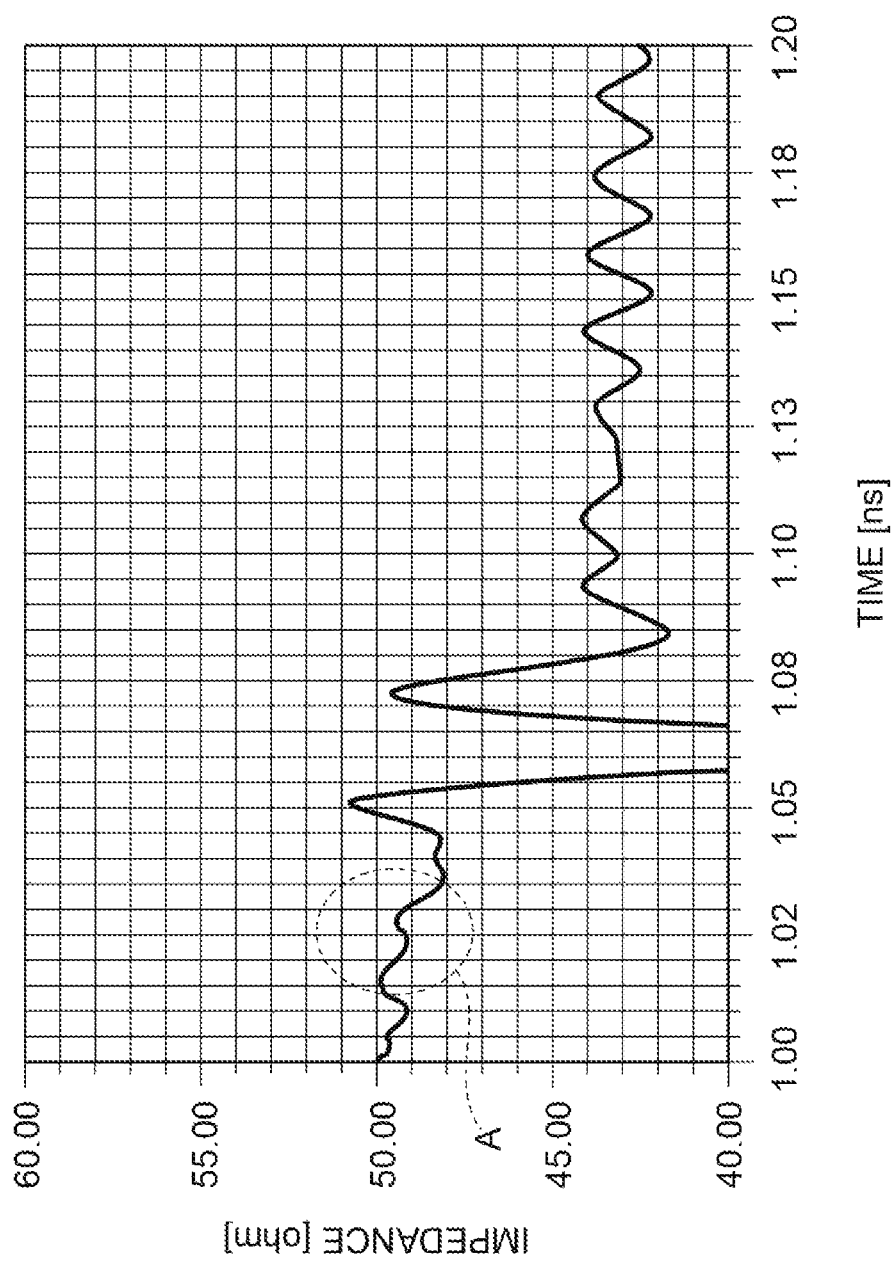
FIG. 19 is a graph illustrating results of measuring an impedance at each position in the transmission direction using a TDR method regarding a signal transmission line in the light emitting portion of the third modification example.

The inventor has measured an impedance at each position in the transmission direction on the signal transmission line in the light emitting portion 20C of the present modification example using a TDR method. In this measurement, the width W1 of the wiring pattern 25d in the direction D2 was set to 135 μm, the gap G1 was set to 185 μm, the width G2 was set to 150 μm, and the length L of the wiring pattern 25d in the direction D3 was set to 250 μm. FIG. 19 is a graph illustrating measurement results. In FIG. 19, the vertical axis indicates impedance (unit: Ω), and the horizontal axis indicates time (unit: nanosecond). With reference to FIG. 19, in the joint part between the wiring pattern 25d and the wiring pattern 242 on the transmission line (part A in FIG. 19), it is clear that a reduced amount of the impedance is controlled to be smaller than the design impedance (50Ω). That is, according to the present modification example, reduction in impedance of the joint part between the wiring pattern 25d and the wiring pattern 242 can be further curbed, and thus mismatching of a characteristic impedance can be more effectively reduced.

The optical semiconductor device and the optical module according to the present disclosure are not limited to the embodiment described above, and various other modifications can be made. For example, a monitor photodiode for detecting a light intensity of backlight from the end face emitting element 27 may be mounted on the carrier mounting surface 25a. In the foregoing embodiment and each of the modification examples, an end face emitting element such as a laser diode has been described as an example of an optical semiconductor element. However, in the present disclosure, various other optical semiconductor elements (including photodetectors) can be applied.

What is claimed is:

1. An optical semiconductor device comprising:
   a dielectric substrate having a carrier mounting surface;
   a first wiring pattern provided on the carrier mounting surface;
   a first reference potential pattern provided on the carrier mounting surface and surrounding the first wiring pattern in a manner of being separated from the first wiring pattern;
   a carrier block provided on the carrier mounting surface and having a main surface extending in a direction intersecting the carrier mounting surface, a side surface facing the carrier mounting surface, and a second wiring pattern and a second reference potential pattern disposed on the main surface and constituting coplanar lines; and
   an optical semiconductor element provided on the main surface of the carrier block,
   wherein one end portion of the second wiring pattern extends to at least an end edge on the side surface side in the main surface and is conductively joined to the first wiring pattern with a conductive joining material therebetween,
   wherein the other end portion of the second wiring pattern is electrically connected to the optical semiconductor element, and
   wherein one end portion of the second reference potential pattern extends to at least the end edge on the side surface side in the main surface and is conductively joined to the first reference potential pattern with a conductive joining material therebetween.

2. The optical semiconductor device according to claim 1, wherein a first gap between the one end portion of the second reference potential pattern and the one end portion of the second wiring pattern on the main surface is larger than a second gap between a remaining portion of the second reference potential pattern and a remaining portion of the second wiring pattern on the main surface.

3. The optical semiconductor device according to claim 2, wherein a side edge in the second reference potential pattern facing the second wiring pattern has a step in a region close to the side surface on the main surface,
   wherein the first gap is a gap between the second reference potential pattern and the second wiring pattern and is positioned between the step and the side surface, and
   wherein the second gap is a gap between the second reference potential pattern and the second wiring pattern and is positioned on a side opposite to the side surface with respect to the step.

4. The optical semiconductor device according to claim 3, wherein the first gap is seven times to nine times the second gap.

5. The optical semiconductor device according to claim 1, wherein each of the one end portions of the second wiring pattern and the second reference potential pattern extends from the main surface to the side surface.

6. The optical semiconductor device according to claim 5, wherein the carrier block has a first groove provided between the second reference potential pattern and the second wiring pattern on the side surface.

7. The optical semiconductor device according to claim 6, wherein the first groove linearly extends from the main surface toward a back surface of the carrier block positioned on a side opposite to the main surface on the side surface.

8. The optical semiconductor device according to claim 6, wherein the carrier block further has a second groove provided on the side surface, and wherein the second reference potential pattern and the second wiring pattern are positioned in one region sandwiching the second groove.

9. The optical semiconductor device according to claim 8, wherein on the side surface, the first groove linearly extends from the main surface toward a back surface of the carrier block positioned on a side opposite to the main surface, and the second groove linearly extends in a direction intersecting the first groove.

10. The optical semiconductor device according to claim 6 further comprising:
a third groove provided between the first reference potential pattern and the first wiring pattern on the carrier mounting surface.

11. The optical semiconductor device according to claim 1,
wherein the other end portion of the second wiring pattern extends to a part immediately below the optical semiconductor element and is conductively joined to a back electrode of the optical semiconductor element with a conductive joining material therebetween.

12. The optical semiconductor device according to claim 1 further comprising:
a metal cap with a window provided on the carrier mounting surface of the dielectric substrate and covering the carrier block and the optical semiconductor element.

13. The optical semiconductor device according to claim 1 further comprising:
a first penetration wiring electrically connected to the first wiring pattern and a wiring provided on an opposite surface positioned on a side opposite to the carrier mounting surface, and penetrating the dielectric substrate from the carrier mounting surface to the opposite surface; and
a second penetration wiring electrically connected to the second wiring pattern and another wiring provided on the opposite surface positioned on a side opposite to the carrier mounting surface, and penetrating the dielectric substrate from the carrier mounting surface to the opposite surface.

14. The optical semiconductor device according to claim 1,
wherein the second wiring pattern extends in a first direction lying along an in-plane direction of the main surface, and
wherein a width of the first wiring pattern in a second direction intersecting the first direction in the in-plane direction is larger than a width of the second wiring pattern in the second direction.

15. An optical module comprising:
the optical semiconductor device according to claim 1; and
an optical receptacle attached to the optical semiconductor device and connected to an optical fiber.

* * * * *